(12) United States Patent
Murasawa et al.

(10) Patent No.: US 7,463,665 B2
(45) Date of Patent: Dec. 9, 2008

(54) SEMICONDUCTOR LASER DIODE

(75) Inventors: Satoshi Murasawa, Hyogo (JP); Toru Takayama, Nara (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/516,509

(22) Filed: Sep. 7, 2006

(65) Prior Publication Data

US 2007/0127532 A1    Jun. 7, 2007

(30) Foreign Application Priority Data

Dec. 1, 2005   (JP)   ............... 2005-348065

(51) Int. Cl.
  *H01S 5/00*   (2006.01)
(52) U.S. Cl. ............... 372/50.12; 372/50.124; 372/50.121
(58) Field of Classification Search ............... 372/46.01, 372/50.12, 50.121, 50.124
See application file for complete search history.

(56) References Cited

U.S. PATENT DOCUMENTS 4,961,197 A * 10/1990 Tanaka et al. ............ 372/45.01
6,387,721 B1 * 5/2002 Hashimoto et al. ............ 438/46
6,618,420 B1 * 9/2003 Gen-Ei et al. ............ 372/50.1
2003/0138015 A1 * 7/2003 Sato et al. ............ 372/45

FOREIGN PATENT DOCUMENTS

JP       5-167177     7/1993
JP       2000-174385  6/2000

* cited by examiner

*Primary Examiner*—Minsun Harvey
*Assistant Examiner*—Patrick Stafford
(74) *Attorney, Agent, or Firm*—McDermott Will & Emery LLP

(57) ABSTRACT

A semiconductor laser diode includes, on a substrate, a first cladding layer; an active layer formed on the first cladding layer; a second cladding layer formed on the active layer and having a ridge stripe for injecting a current into the active layer; and a light emitting portion formed on both sides of the ridge stripe and having a current blocking layer for confining the current in the ridge stripe. A distance from a lower face of the current blocking layer to an upper face of the active layer is within a given range. Also, the current spreads beyond a width of the ridge stripe after passing the ridge stripe and before reaching the active layer.

13 Claims, 15 Drawing Sheets

LIGHT DISTRIBUTION

SEMICONDUCTOR LASER DIODE

CROSS-REFERENCE TO RELATED APPLICATIONS

This application claims priority under 35 U.S.C. §119 on Patent Application No. 2005-348065 filed in Japan on Dec. 1, 2005, the entire contents of which are hereby incorporated by reference.

BACKGROUND OF THE INVENTION

The present invention relates to a semiconductor laser diode, and more particularly, it relates to a semiconductor laser diode whose longitudinal mode is multi-longitudinal mode including self sustained pulsation.

Recently, a semiconductor laser diode is frequently used as an optical pickup light source for use in an optical recording device or reading device for a recording medium such as an optical disk or a magneto-optical recording disk. Such semiconductor laser diodes are widely applied to a recorder, a PC, a vehicle and the like, and the market of optical disks is being increasing. In particular, there is a large demand for on-vehicle application typified by a car navigation system, and a demand for optical pickup device capable of reproducing all disks including CDs and DVDs is increasing.

What an on-vehicle optical pickup device is strongly required are (1) compactness, (2) wide operation temperature guarantee for operating in a wide temperature range from a low temperature to a high temperature and (3) suppression of signal degradation (noise reduction).

First, for (1) compactness of an optical pickup device, it is effective to simplify the device by reducing optical components, and in one method for this purpose, a red semiconductor laser of a 650 nm band for a DVD and an infrared semiconductor laser of a 780 nm band for a CD are integrally provided on one semiconductor substrate as a monolithic semiconductor laser. Thus, the semiconductor laser itself can be integrated as one component as well as optical components such as a collimator lens and a beam splitter can be shared by the red semiconductor laser and the infrared semiconductor laser, and hence, this method is useful for the compactness.

Also, for (2) wide operation temperature guarantee, it is necessary to improve the temperature characteristic of the semiconductor laser diode itself. As one method for this purpose, technique disclosed in Japanese Laid-Open Patent Publication No. 2000-174385 (hereinafter referred to as Patent Document 1) is known. Patent Document 1 describes that when a taper stripe structure in which the width of a ridge is changed along an optical path direction is employed, a lower current density can be attained than in a general straight stripe structure and the temperature characteristic can be improved by suppressing heat generation of the diode through reduction of differential resistance owing to a large ridge width.

Next, with respect to (3) suppression of signal degradation (noise reduction), a factor to cause noise will be first examined.

There is little light returning from an optical disk, an optical recording medium or an optical system to a semiconductor laser diode. Therefore, in the case where the laser beam has high coherence, light obtained within a resonator and the returned light affect each other, resulting in causing noise in an output of the semiconductor laser diode.

As a countermeasure for such noise derived from the returned light, a method in which the semiconductor laser diode is subjected to fast modulation, a method in which multi-longitudinal mode is employed for the oscillation mode of the semiconductor laser diode, a method in which the semiconductor laser diode itself is placed in a pulse oscillation state or the like is employed.

In the method in which the semiconductor laser diode is subjected to the fast modulation, however, a high-frequency superposed module is used and hence the number of components is increased. Therefore, this method is disadvantageous in the compactness and the cost of the optical pickup. Furthermore, equipment using a high frequency (such as an ETC (electronic toll collection system)) apart from the high-frequency superposed module for the fast modulation of the semiconductor laser diode is frequently mounted on a recent vehicle. Therefore, resonance may be caused between the frequencies of these equipment so as to cause a problem of malfunction of the equipment. Accordingly, the method in which the semiconductor laser diode is subjected to the fast modulation cannot be the best method.

On the other hand, as the method in which the multi-longitudinal mode is employed for the oscillation mode, a gain guide structure used for the optical waveguide mechanism is well known. Since the threshold current is increased when the gain guide structure is used, however, the operation power is increased and this method is disadvantageous for the temperature characteristic.

Also, as the method in which the semiconductor laser diode is pulse oscillated, the spread of a current is made narrower than the spread of light so as to form a saturable absorber in an active layer. As one means for forming a saturable absorber, technique disclosed in Japanese Patent Publication No. 3183692 (hereinafter referred to as Patent Document 2) is known. In the technique disclosed in Patent Document 2, the resistance of a semiconductor layer disposed between a current blocking layer and an active layer is set to be higher than that of the active layer. Thus, a current can be allowed to reach the active layer while suppressing the spread of the current to be equivalent to the width of a ridge stripe, and light is not supplied in a portion not having the stripe width because no current passes this portion, and hence, the laser beam is absorbed in this portion so as to form a saturable absorber. As a result, self sustained pulsation can be performed.

In such a semiconductor laser diode, the thickness of the semiconductor layer disposed between the current blocking layer and the active layer is approximately 0.45 µm through 0.65 µm when it is an infrared laser diode and is approximately 0.25 µm through 0.4 µm when it is a red laser diode.

SUMMARY OF THE INVENTION

In the above-described structure, since the current spread is equivalent to the stripe width, the self sustained pulsation can be performed stably at room temperature. However, when the temperature is high, since the current spread is suppressed, the current injected into the active layer is concentrated in a portion directly below the stripe, so as to increase the operation current density. Therefore, a leakage current is increased and the heat generation in the diode is increased, so as to lower the emission efficiency. Accordingly, when the temperature is high, there arises a problem that the optical output is thermally saturated due to the heat generation in the diode in a current-optical output characteristic (I-L characteristic), which largely affects an on-vehicle laser diode necessary to guarantee a wide operation temperature range.

Accordingly, the present invention provides a semiconductor laser diode in which a longitudinal mode can stably keep multi-longitudinal mode oscillation (including self sustained pulsation) characteristics and temperature characteristics in a wide temperature range from a low temperature to a high temperature.

The first semiconductor laser diode of this invention includes a light emitting portion on a substrate, and the light emitting portion includes a first cladding layer; an active layer formed on the first cladding layer; a second cladding layer formed on the active layer and having a ridge stripe for injecting a current into the active layer; and a current blocking layer formed on both sides of the ridge stripe for confining the current in the ridge stripe, and a distance from a lower face of the current blocking layer to an upper face of the active layer is within a given range, and the current spreads beyond a width of the ridge stripe after passing the ridge stripe and before reaching the active layer.

At this point, a full width at half maximum of a current distribution is regarded as the current spread. Specifically, in the first semiconductor laser diode, the full width at half maximum of a current distribution on the active layer of the current having passed the ridge stripe spreads beyond the width of the ridge stripe. Also, expressions such as a width and lateral spread are herein used for a distance along the parallel direction.

In the first semiconductor laser diode, since the distance (remaining thickness) from the lower face of the current blocking layer to the upper face of the active layer is not less than a given value, the current having passed the ridge stripe spreads in the lateral direction (the parallel direction) before reaching the active layer, and hence, the full width at half maximum of the current distribution is larger than the width of the ridge stripe. However, an optical field distribution spreads further beyond this current spread, and a sufficient saturable absorber is formed as a result, so as to stably cause multi-longitudinal mode oscillation. Furthermore, since the remaining thickness has an upper limit, higher-order lateral mode oscillation is suppressed so as to cause oscillation in the fundamental lateral mode alone.

The given range is preferably set to have a lower limit corresponding to the distance (that is, the distance from the lower face of the current blocking layer to the upper face of the active layer, i.e., the remaining thickness) obtained at a point where increase of lateral spread of the current becomes gentle against increase of the distance and an upper limit corresponding to the distance obtained at a point where increase of a full width at half maximum of an NFP (Near Field Pattern) becomes gentle against the increase of the distance.

Since the given range is thus defined, effects to stabilize the multi-longitudinal mode oscillation and to cause oscillation in the fundamental lateral mode can be definitely attained. It is noted that the points where the increase of the current lateral spread and the increase of the full width at half maximum of the NFP become gentle against the increase of the remaining thickness can be experimentally obtained.

Specifically, the given range is preferably 0.65 µm or more and 1.2 µm or less. When the remaining thickness is within this range, oscillation of the fundamental lateral mode and the multi-longitudinal mode can be realized.

In the first semiconductor laser diode, the current having passed the current blocking layer spreads laterally, and hence, a current density can be prevented from increasing because of the current concentrated in the active layer. Therefore, occurrence of a leakage current and heat generation can be suppressed in the semiconductor laser diode, so that it can be stably operated even at a high temperature.

In this manner, in the first semiconductor laser diode, wide operation temperature guarantee and oscillation of the fundamental lateral mode and the multi-longitudinal mode can be both attained.

The active layer is preferably made of $Al_xGa_{1-x}As$ (wherein $0 \leq x \leq 1$), and the first cladding layer and the second cladding layer are preferably made of an AlGaInP-based material.

When such a structure is employed, the semiconductor laser diode can definitely attain both of the wide operation temperature guarantee and the oscillation of the fundamental lateral mode and the multi-longitudinal mode.

It is noted that the AlGaInP-based material means a material having a composition expressed as $(Al_wGa_{1-w})_zIn_{1-z}P$ (wherein $0 \leq w \leq 1$ and $0 \leq z \leq 1$).

The width of the ridge stripe is preferably 1 µm or more and 4 µm or less.

Thus, since the width of the ridge stripe is 4 µm or less, a far field pattern (FFP) along the horizontal direction can be prevented from having a double-humped property. Also, when the width of the ridge stripe is too small, the resistance is increased so as to generate heat, resulting in degrading the temperature characteristic. For preventing this, the width of the ridge stripe is preferably 1 µm or more. Also, the width of 1 µm or more is an example of the minimum width realized for forming a ridge stripe in consideration of the process.

Also, the given range is preferably 0.4 µm or more and 0.7 µm or less. Furthermore, the active layer is preferably made of $Ga_yIn_{1-y}P$ (wherein $0 \leq y \leq 1$), and the first cladding layer and the second cladding layer are preferably made of an AlGaInP-based material. Moreover, the width of the ridge stripe is preferably 2.5 µm or more and 5.5 µm or less.

Also in these cases, the effects of the semiconductor laser diode of this invention can be definitely attained.

Furthermore, the ridge stripe preferably has side faces vertical to a principal plane of the substrate.

When such a vertical ridge structure is used, differential resistance Rs can be reduced as compared with the case where a ridge stripe having a smaller width on the top than on the bottom is used, and hence, the heat generation in the diode can be suppressed. As a result, the semiconductor laser diode can realize wider operation temperature guarantee.

The second semiconductor laser diode of this invention includes, on a substrate, at least a first light emitting portion and a second light emitting portion, and each of the first light emitting portion and the second light emitting portion includes a first cladding layer; an active layer formed on the first cladding layer; a second cladding layer formed on the active layer and having a ridge stripe for injecting a current into the active layer; and a current blocking layer formed on both sides of the ridge stripe for confining the current in the ridge stripe, a distance from a lower face of the current blocking layer to an upper face of the active layer is a value in a given range in both of the first light emitting portion and the second light emitting portion, and the current spreads beyond a width of the ridge stripe after passing the ridge stripe and before reaching the active layer in both of the first light emitting portion and the second light emitting portion.

Also in the second semiconductor laser diode, a full width at half maximum is regarded as current spread as in the first semiconductor laser diode.

In the second semiconductor laser diode, the distance (remaining thickness) from the lower face of the current blocking layer to the upper face of the active layer is defined in each of the first and second light emitting portions, and hence, oscillation of the fundamental lateral mode and the multi-longitudinal mode can be stably caused. In addition, since the current spreads in the active layer, increase of the current density is avoided, and hence, the second semiconductor laser diode is a monolithic two-wavelength laser diode stably operating even at a high temperature.

Specifically, the given range in the first light emitting portion is preferably 0.65 μm or more and 1.2 μm or less, and the given range in the second light emitting portion is preferably 0.4 μm or more and 0.7 μm or less.

When the remaining thicknesses are thus defined, wide operation temperature guarantee and stability of the oscillation mode can be realized in each of the light emitting portions respectively emitting different kinds of lasers.

The ridge stripe is preferably simultaneously formed in the first light emitting portion and the second light emitting portion.

Thus, a distance between light emitting points of the first and second light emitting portions (namely, a distance between their ridge stripes) can be more highly precisely set than in the case where the ridge stripes are independently formed. This is very advantageous in mounting a laser diode and an optical component in an optical pickup device or the like. Specifically, if the distance between light emitting points is varied, the optical component should be mounted in accordance with the variation, which increases the difficulty in assembling and causes characteristic degradation such as lowering of laser beam utilization efficiency. However, such problems can be avoided when a plurality of ridge stripes are simultaneously formed. In addition, the number of procedures can be reduced as compared with the case where the ridge stripes are independently formed.

The ridge stripe preferably has side faces vertical to a principal plane of the substrate in at least one of the first light emitting portion and the second light emitting portion.

Thus, the differential resistance Rs can be reduced as compared with the case where a ridge stripe having a smaller width on the top than on the bottom is used, and hence the heat generation in the diode can be suppressed. As a result, the semiconductor laser diode can attain wider operation temperature guarantee.

The active layer of the first light emitting portion is preferably made of $Al_xGa_{1-x}As$ (wherein $0 \leq x \leq 1$), the active layer of the second light emitting portion is preferably made of $Ga_yIn_{1-y}P$ (wherein $0 \leq y \leq 1$), and the first cladding layer and the second cladding layer are preferably made of an AlGaInP-based material.

Thus, the wide operation temperature guarantee and the stability of the oscillation mode can be definitely realized in both of the light emitting portions.

The width of the ridge stripe of the first light emitting portion is preferably 1.0 μm or more and 4.0 μm or less, and the width of the ridge stripe of the second light emitting portion is preferably 2.5 μm or more and 5.5 μm or less.

Thus, since the width of the ridge stripe is 4 μm or less in the first light emitting portion and 5.5 μm or less in the second light emitting portion, an FFP along the horizontal direction can be prevented from having a double-humped property. Also, the lower limit of the width in the first light emitting portion (i.e., 1 μm) is an example of the minimum width in consideration of the process, and the lower limit of the width in the second light emitting portion (i.e., 2.5 μm) is a value for preventing external differential efficiency from having non-linearity in the I-L characteristic.

The ridge stripe preferably has a taper stripe structure having a changing width in at least one of the first light emitting portion and the second light emitting portion.

When such a taper stripe structure is employed, the stripe width can be larger than in employing a straight stripe structure, and hence, the differential resistance Rs can be reduced so as to suppress the heat generation in the diode, and thus, the temperature characteristic can be improved.

The taper stripe structure preferably has a width gradually increased from a side of an emitting facet for emitting light toward a side of a rear facet opposing the emitting facet.

Alternatively, the taper stripe structure preferably has a width gradually reduced from a center thereof toward a side of an emitting facet for emitting light and toward a side of a rear facet opposing the emitting facet.

The specific structure of the taper stripe structure may be one of the above. It is noted that the width of the ridge stripe of such a taper stripe structure is an average width calculated by assuming that the taper stripe structure is a straight stripe structure.

As described so far, in the semiconductor laser diode of this invention, the distance from the lower face of the current blocking layer to the upper face of the active layer is defined within the given range, so as to control the lateral spread of the current in the active layer. Thus, the oscillation of the fundamental lateral mode and the multi-longitudinal mode can be realized, and the occurrence of a leakage current and the heat generation are suppressed because the current density is suppressed in the active layer, and therefore, the semiconductor laser diode can be stably operated even at a high temperature.

BRIEF DESCRIPTION OF THE DRAWINGS

FIG. 1A is a cross-sectional view thereof, FIG. 1B is a detailed cross-sectional view of an active layer and FIG. 1C is a plan view of a stripe portion;

FIG. 8A is a cross-sectional view thereof, FIG. 8B is a detailed cross-sectional view of an active layer of a red laser section and FIG. 8C is a plan view of stripe portions;

FIG. 15A is a cross-sectional view thereof, FIG. 15B is a detailed cross-sectional view of an active layer and FIG. 15C is a plan view of stripe portions.

DETAILED DESCRIPTION OF THE INVENTION

Preferred embodiments of the invention will now be described with reference to the accompanying drawings.

Embodiment 1

Figure 1A:
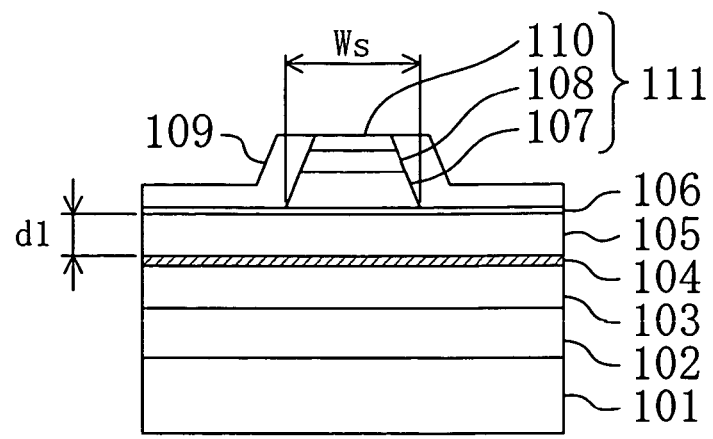
FIGS. 1A, 1B and 1C are diagrams for showing the structure of a semiconductor laser diode according to Embodiment 1 of the invention, and specifically.
Figure 1B:
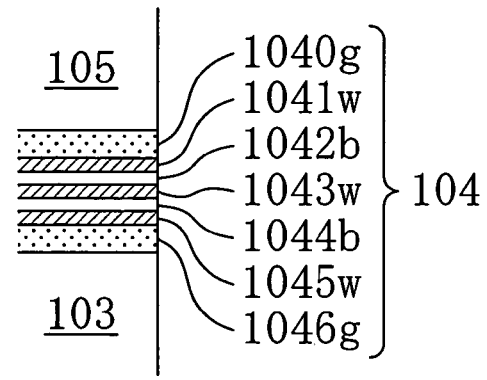
Figure 1C:
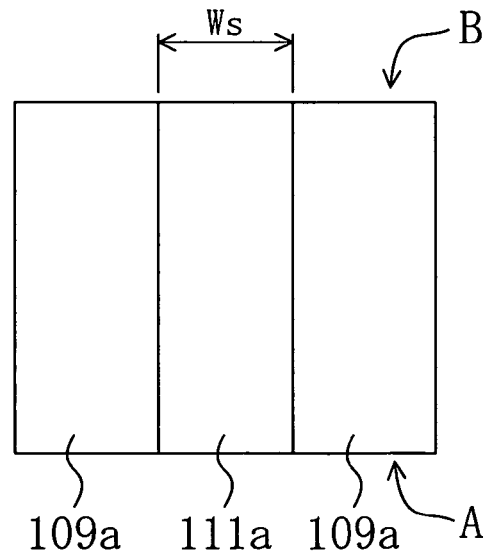

A semiconductor laser diode according to Embodiment 1 of the invention will now be described. FIGS. 1A, 1B and 1C are diagrams of the semiconductor laser diode of this embodiment. First, FIG. 1A shows the cross-sectional view thereof.

The semiconductor laser diode has a structure in which an n-type GaAs buffer layer 102, an n-type (AlGa)InP cladding layer 103, an active layer 104, a p-type (AlGa)InP first cladding layer 105, a p-type GaInP etching stopper layer 106, a p-type (AlGa)InP second cladding layer 107, a p-type GaInP intermediate layer 108 and a p-type GaAs contact layer 110 are successively stacked in this order in the upward direction on an n-type GaAs substrate 101. Thus, the semiconductor laser diode has a double hetero structure in which the active layer 104 is sandwiched between the two cladding layers, namely, the n-type (AlGa)InP cladding layer 103 and the p-type (AlGa)InP first cladding layer 105.

At this point, the active layer 104 is a quantum well active layer having three well layers as shown in FIG. 1B. Specifically, three GaAs well layers 1045w, 1043w and 1041w are successively formed in the upward direction so as to sandwich two (AlGa)InP barrier layers 1044b and 1042b among them, and this five-layered structure is sandwiched between two (AlGa)InP guide layers 1040g and 1046g. As a result, the layers 1046g, 1045w, 1044b, 1043w, 1042b, 1041w and 1040g are stacked in this order from the lower side (namely, the side of the n-type (AlGa)InP cladding layer 103). It is noted that the p-type (AlGa)InP first cladding layer 105 is disposed on the upper most (AlGa)InP guide layer 1040g.

Furthermore, as shown in FIG. 1A, the p-type (AlGa)InP second cladding layer 107, the p-type GaInP intermediate layer 108 and the p-type GaAs contact layer 110 are formed as a ridge stripe in the shape of a mesa stripe, so as to construct a stripe portion 111 having a larger width on its bottom than on its top. Moreover, an n-type GaAs current blocking layer 109 is formed on both sides of the stripe portion 111 so as to bury the stripe portion 111. The stripe portion 111 and the n-type GaAs current blocking layer 109 thus formed on the p-type (AlGa)InP first cladding layer 105 construct a current confining structure for confining a region of a current injected into the active layer 104.

In FIG. 1A, a distance (remaining thickness) from the lower face of the n-type current blocking layer 109 (namely, the lower face of the ridge stripe) to the upper face of the active layer 104 is shown as a distance d1.

The plane structure of such a current confining structure is schematically shown in FIG. 1C. In this case, a shape 111a of the lower face of the stripe portion 111 is shown, and the shape 111a has the same width over its whole length from an emitting facet A to a rear facet B. This width of the lower face of the stripe portion 111 is herein designated as a stripe width Ws. The rest of the plane shape corresponds to a shape 109a of the lower face of the n-type current blocking layer 109.

Furthermore, although not shown in the drawings, a p-type electrode is formed on the p-type GaAs contact layer 110 and the n-type current blocking layer 109, and an n-type electrode is formed on the lower face of the n-type GaAs substrate 101. The semiconductor laser diode has such a structure and is a laser diode for emitting infrared laser.

As for the material of each layer, for example, with respect to the n-type (AlGa)InP cladding layer 103, the p-type (AlGa) InP first cladding layer 105 and the p-type (AlGa)InP second cladding layer 107, an exemplified composition ratio is $(Al_{0.7}Ga_{0.3})_{0.51}In_{0.49}P$. Also, with respect to the (AlGa)InP guide layers 1040g and 1046g and the (AlGa)InP barrier layers 1042b and 1044b, an exemplified composition ratio is $(Al_{0.4}Ga_{0.6})_{0.51}In_{0.49}P$.

Figure 2A:
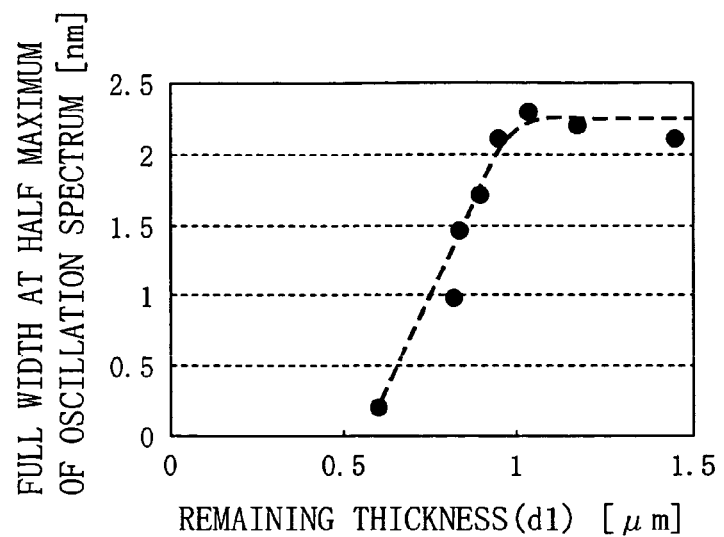
FIG. 2A is a diagram for showing the relationship between a distance (remaining thickness) d1 from a lower face of a current blocking layer to an upper face of an active layer and the full width at half maximum of an oscillation spectrum and FIGS. 2B, 2C and 2D are diagrams of spectra corresponding to various distances d1.

FIG. 2A shows the behavior of the multi-longitudinal mode property (the full width at half maximum of an oscillation spectrum) against the change of the remaining thickness d1 in the semiconductor laser diode having the aforementioned structure. It is assumed, in this case, that the stripe width Ws is set to a constant value of 1.5 μm and that the measurement is performed at room temperature and at 4 mW.

Figure 2B:
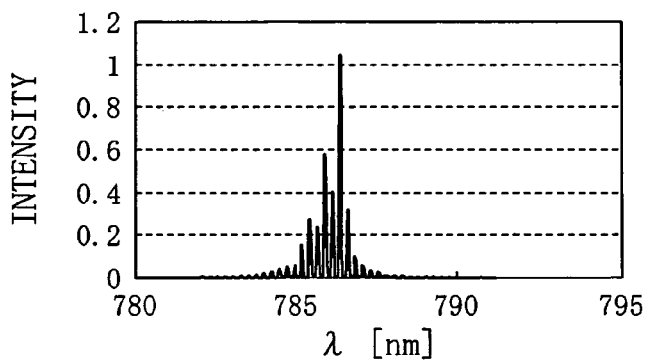
Figure 2C:
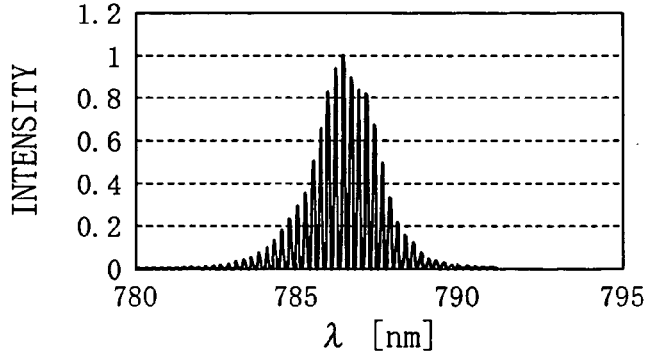
Figure 2D:
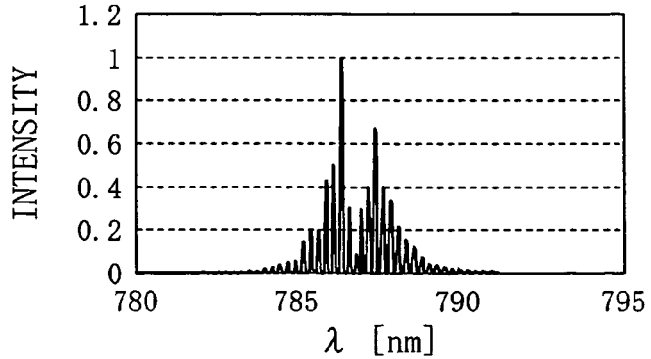

As shown in FIG. 2A, when the remaining thickness d1 is increased, the full width at half maximum of the oscillation spectrum is increased at first, but when the remaining thickness d1 is 1 μm or more, the full width at half maximum of the oscillation spectrum is substantially constant. FIGS. 2B, 2C and 2D show the actual spectrum waveforms obtained when the remaining thickness d1 is 0.6 μm, 0.95 μm and 1.45 μm. The oscillation spectrum is close to a single peak in the case shown in FIG. 2B where the remaining thickness d1 is 0.6 μm, is multi-longitudinal mode with a large full width at half maximum in the case shown in FIG. 2C where the remaining thickness d1 is 0.95 μm, and starts to exhibit a double-humped property in the case shown in FIG. 2D where the remaining thickness d1 is 1.45 μm.

This can be explained by using an effective refractive index difference Δn between a portion corresponding to the stripe portion 111 and portions corresponding to the both sides of the stripe portion 111.

In the case where the remaining thickness d1 is 0.6 μm, the difference Δn is approximately $1 \times 10^{-3}$. Owing to this comparatively large difference Δn, light cannot spread to the side of the ridge, and hence, a saturable absorber is difficult to form. As a result, the full width at half maximum of the oscillation spectrum is small.

On the contrary, in the case where the remaining thickness d1 is 1.45 μm, the difference Δn is as small as approximately $1 \times 10^{-5}$. Therefore, light can spread to the side of the ridge, but a current also excessively spreads because the remaining thickness is too large. As a result, the diode has a gain in a wide range of wavelength, and hence, the multi-longitudinal mode oscillation can be easily caused and higher-order lateral mode oscillation can be caused. Since the higher-order lateral mode and fundamental lateral mode are different in the propagation constant, two oscillation spectra respectively corresponding to the higher-order lateral mode and the fundamental lateral mode are both generated. This seems to be the cause of the double-humped spectrum shown in FIG. 2D.

It is confirmed, based on the aforementioned findings, that the range of the remaining thickness d1 for keeping the stable lateral mode typified by the spectrum shown in FIG. 2C and for enabling the multi-longitudinal mode oscillation is approximately 0.65 μm through 1.2 μm.

Figure 3A:
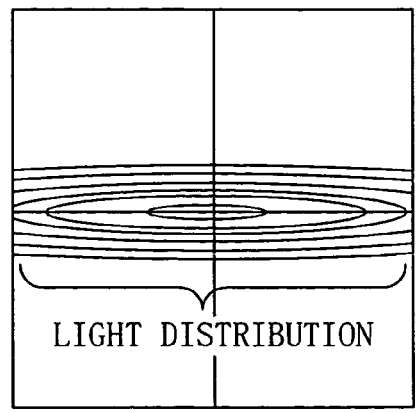
FIG. 3A is an NFP image of a threshold current of the semiconductor laser diode of Embodiment 1 and FIG. 3B is a diagram for showing a laterally spread current and the full width at half maximum of the NFP against the remaining thickness d1.

In a conventional general semiconductor laser diode, a remaining thickness d1 for the self sustained pulsation of infrared laser is 0.45 μm through 0.65 μm (corresponding to a difference Δn of $3 \times 10^{-3}$ through $1 \times 10^{-3}$). In contrast, although the remaining thickness d1 is as large as 0.65 μm through 1.2 μm (corresponding to a difference Δn of $1 \times 10^{-3}$ through $5 \times 10^{-5}$) in this embodiment, the multi-longitudinal mode oscillation (including the self sustained pulsation) can be performed. The reason is as follows:

FIG. 3A shows a near field pattern (NFP) image obtained in a threshold current state of a sample with a constant stripe width Ws of 1.5 μm and a remaining thickness d1 of 0.9 μm. The NFP image shows an optical field distribution (a distribution of light intensity), and the degree of light spread can be expressed by using a full width at half maximum obtained from the optical field distribution.

Figure 3B:
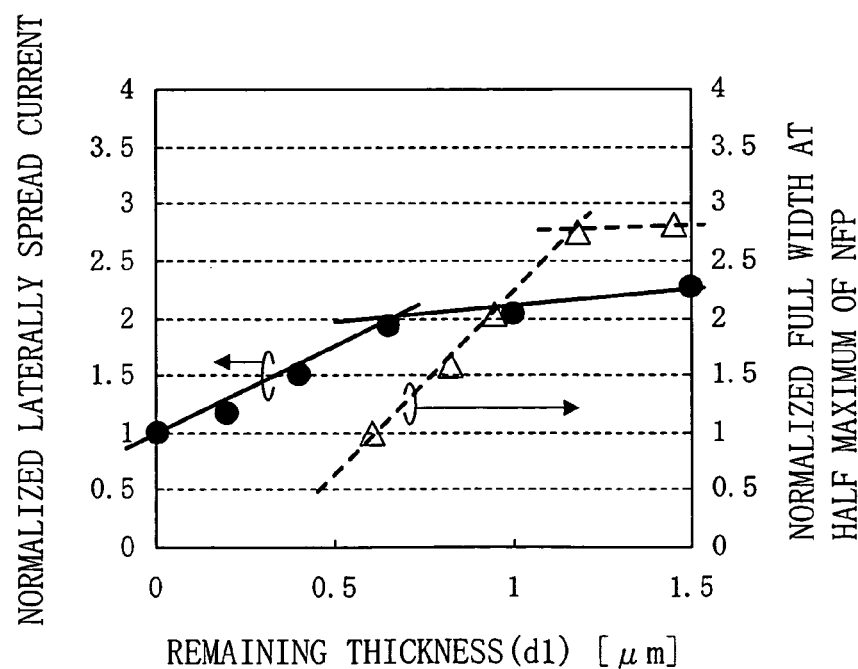

FIG. 3B shows the full width at half maximum of an NFP image obtained in a threshold current state normalized on the basis of a remaining thickness d1 of 0.6 μm (shown with broken lines) and laterally spread current (calculated values) normalized on the basis of the remaining thickness d1 of 0 μm (shown with solid lines). In other words, the full width at half maximum and the laterally spread current are shown by using ratios to the base values. The full width at half maximum of the NFP image is larger at first as the remaining thickness d1 is larger, and when the remaining thickness d1 exceeds approximately 1.2 μm, it is gently increased and becomes almost constant. On the other hand, the laterally spread current is increased as the remaining thickness d1 is increased to approximately 0.65 μm but is almost saturated (namely, is gently increased) thereafter.

In this manner, in the range of the remaining thickness d1 of 0.65 through 1.2 μm, the laterally spread current is almost saturated and the optical field distribution (spread) is increased, and therefore, this range can be regarded as a region where a saturable absorber is increased. On the contrary, when the remaining thickness d1 is 1.2 μm or more, the optical field distribution (spread) and the laterally spread current are both substantially constant, the saturable absorber is not increased, and as a result, the full width at half maximum of the oscillation spectrum is substantially constant. Accordingly, a region where a saturable absorber can be easily formed is a region where the remaining thickness d1 is 0.65 μm or more. The above-described region where the oscillation spectrum does not exhibit the double-humped property is the region where the remaining thickness d1 is 1.2 μm or less, and therefore, a preferable range of the remaining thickness d1 for enabling the stable multi-longitudinal mode oscillation is 0.65 μm through 1.2 μm.

In this manner, in the semiconductor laser diode of this embodiment, since the remaining thickness is larger than in the conventional technique, the lateral spread of the current is larger, but a light emitting portion is further increased. As a result, a saturable absorber is sufficiently formed, so that the stable fundamental lateral mode can be kept and that the multi-longitudinal mode oscillation can be performed.

Next, the degree of the current spread against the stripe width Ws will be described by using an NFP image obtained before laser oscillation. Since the NFP image obtained before the laser oscillation is strongly correlated with a density distribution of a current injected into an active layer, it can be used for evaluating the current spread.

Figure 4A:
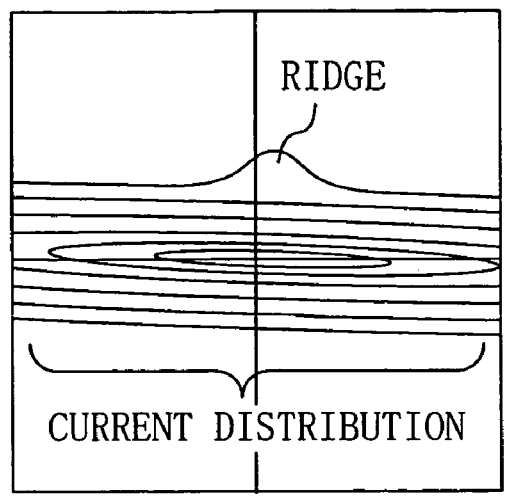
FIG. 4A is an NFP image obtained when a current of 10 mA is allowed to pass through the semiconductor laser diode of Embodiment 1 and FIG. 4B is a diagram for showing the relationship between a stripe width and the full width at half maximum of the NFP.

FIG. 4A shows an NFP image obtained by allowing a current of 10 mA to pass a laser diode with a stripe width Ws of 1.7 μm and a remaining thickness d1 of 0.9 μm, and the NFP image can be regarded also as a current distribution because of the aforementioned strong correlation. As shown in FIG. 4A, since the remaining thickness d1 is 0.9 μm and comparatively large, the current is widely spread in the lateral direction, and this spread is 5.8 μm when expressed by using the full width at half maximum. The stripe width Ws is 1.7 μm, and hence, the current is spread three or more times as large as the stripe width Ws.

Figure 4B:
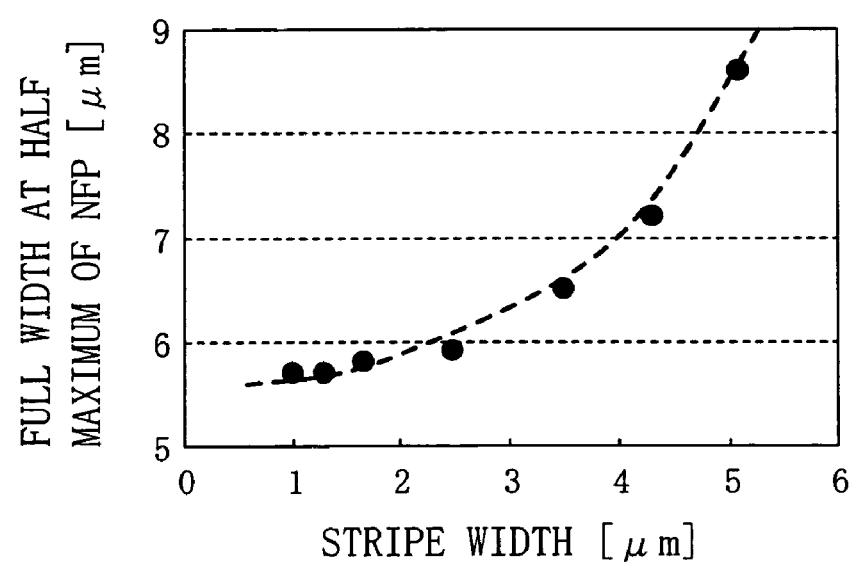

FIG. 4B shows the behavior of the current spread expressed by using the full width at half maximum obtained when the stripe width Ws is changed. According to FIG. 4B, when the stripe width Ws is 1 μm, the full width at half maximum is 5.7 μm, and the current spread becomes larger as the stripe width Ws is increased, and when the stripe width Ws is 5 μm, the full width at half maximum is 8 μm or more.

In this manner, although the current lateral spread is equivalent to the stripe width in the conventional semiconductor laser diode, the current spread is larger than the stripe width in the semiconductor laser diode of this embodiment because of the large remaining thickness d1.

Figure 5A:
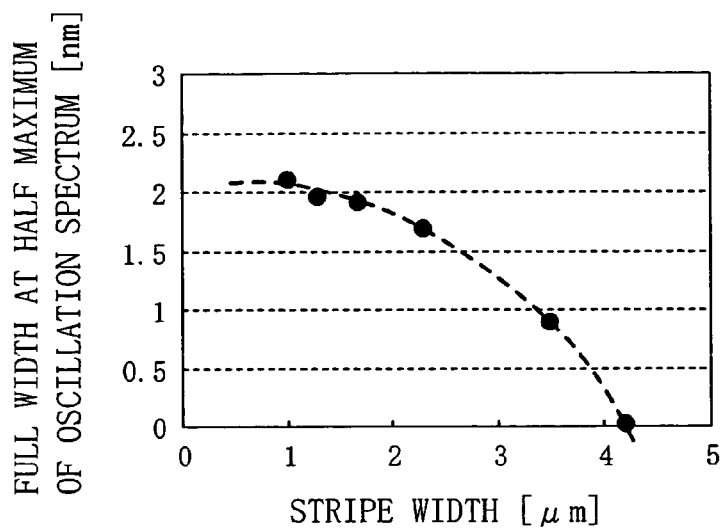
FIG. 5A is a diagram for showing the relationship between the stripe width and the full width at half maximum of an oscillation spectrum obtained in the semiconductor laser diode of Embodiment 1 and FIGS. 5B, 5C and 5D are diagrams of oscillation spectra corresponding to various stripe widths.
Figure 5B:
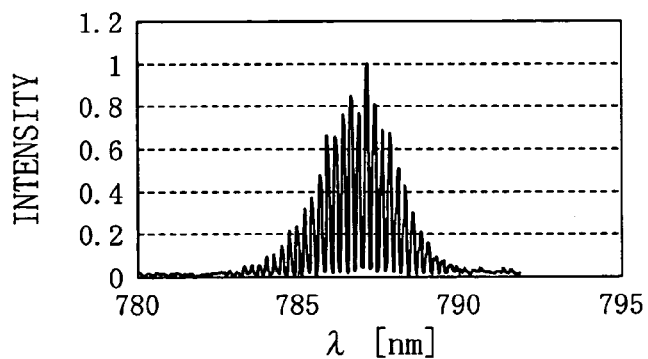
Figure 5C:
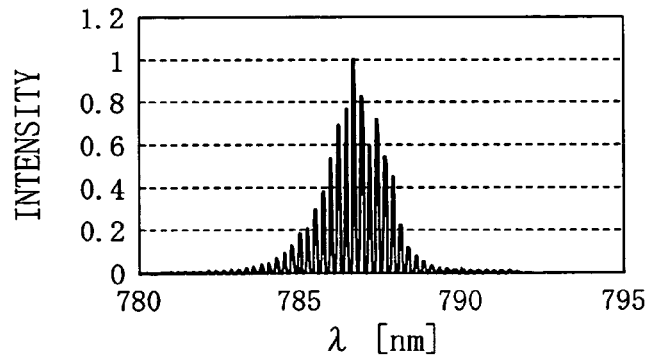
Figure 5D:
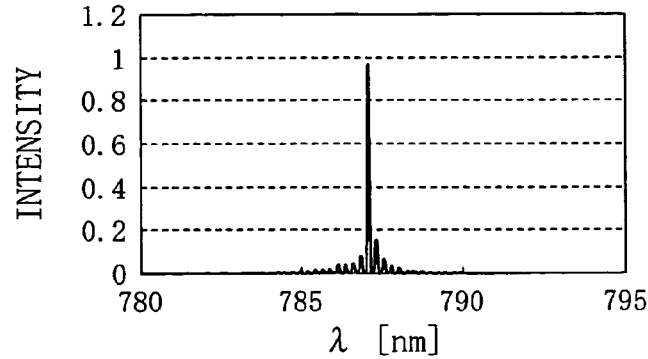

Furthermore, FIG. 5A shows the behavior of the multi-longitudinal mode property (the full width at half maximum of an oscillation spectrum) obtained with the remaining width d1 set to be a constant value of 0.85 μm and the stripe width changed. In particular, the oscillation spectra obtained when the stripe width Ws is 1.3 μm, 2.3 μm and 4.2 μm are respectively shown in FIGS. 5B, 5C and 5D. As shown in FIGS. 5B through 5D, as the stripe width Ws is larger, the full width at half maximum of the oscillation spectrum is reduced.

This seems for the following reason: First, as the stripe width Ws is larger, the diffusion distance in the lateral direction of the current below the ridge stripe portion is larger. Therefore, the volume of the active layer into which the current is injected is larger below the ridge stripe portion. As a result, the volume of a saturable absorber formed in the active layer below the current blocking layer is relatively small as compared with the volume of the active layer into which the current injected. Accordingly, the self sustained pulsation is difficult to cause.

Furthermore, when the stripe width Ws is 4.2 µm, a phenomenon that a far field pattern (FFP) along the horizontal direction has a double-humped property and a kink is caused in the vicinity of 9 mW is observed. This reveals that the upper limit of the stripe width Ws is approximately 4 µm in consideration of the characteristics of the diode. Also, since a stripe width of 1 µm is the process limit in forming a stripe, the lower limit is 1 µm. When the stripe width is smaller than the lower limit, the differential resistance is too high to generate heat, which harmfully affects the temperature characteristic.

Figure 6A:
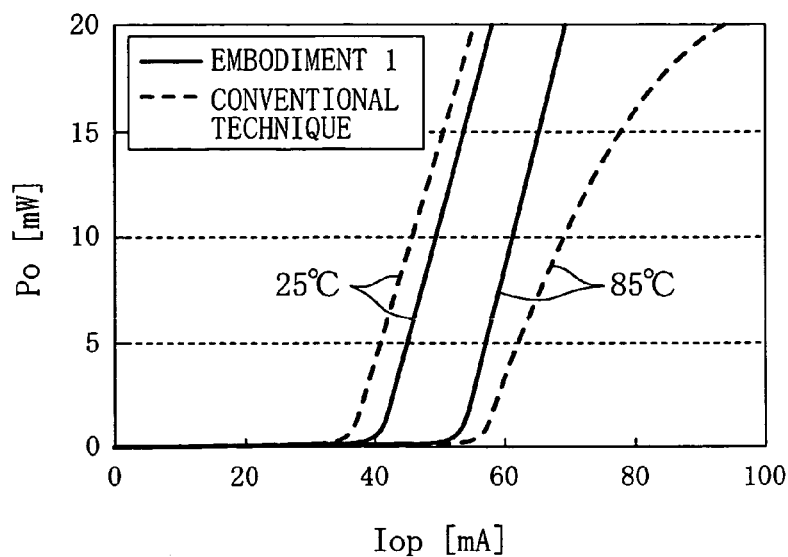
FIG. 6A is a diagram for showing I-L characteristics obtained in Embodiment 1 and a conventional diode.

On the basis of the aforementioned results, the temperature characteristic is compared between the structure of the semiconductor laser diode of this embodiment and the conventional structure. As the results of the comparison, FIG. 6A shows the temperature dependency of the I-L characteristic and FIGS. 6B and 6C respectively show the temperature dependency of the oscillation spectrum in this embodiment and in the conventional technique. At this point, the remaining thickness d1 is 0.83 µm in the structure of this embodiment, and the remaining thickness is 0.5 µm in the conventional structure. When the remaining thickness d1 is converted into a difference $\Delta n$, the different $\Delta n$ is $4\times10^4$ in the structure of this embodiment and is $2.5\times10^{-3}$ in the conventional structure. It is noted that the stripe width Ws is 2.7 µm in the both structures and the composition ratios are set to the above-described values.

As shown in FIG. 6A, in the I-L characteristic obtained at 25° C., the conventional structure has a lower threshold current. However, in the I-L characteristic obtained at 85° C., the structure of this embodiment has a lower threshold current. This seems for the following reason: At a temperature of 25° C., the current lateral spread is smaller in the conventional structure than in the structure of this embodiment because of the smaller remaining thickness, and an unavailable current not related to the oscillation is smaller, and hence, the current is efficiently converted into light. Also, one factor of the good I-L characteristic seems to be that the waveguide loss in the active layer is reduced because the difference $\Delta n$ is comparatively large. On the other hand, at a temperature of 85° C., the current injected into the active layer is concentrated in a portion directly below the stripe so as to increase the current density in the conventional structure, and a leakage current is caused in the diode so as to generate heat, which degrades the temperature characteristic. In this manner, the semiconductor laser diode of this embodiment has wider operation temperature guarantee than the conventional diode.

Figure 6B:
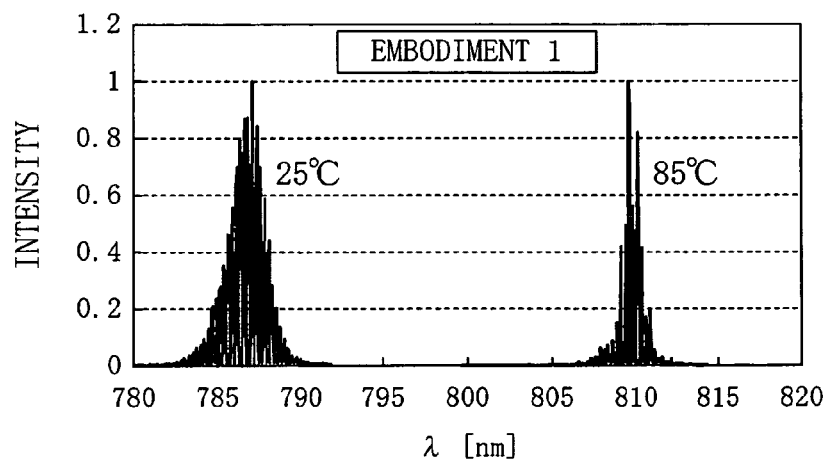
FIG. 6B is a diagram of oscillation spectra obtained at 25° C. and 85° C. in Embodiment 1
Figure 6C:
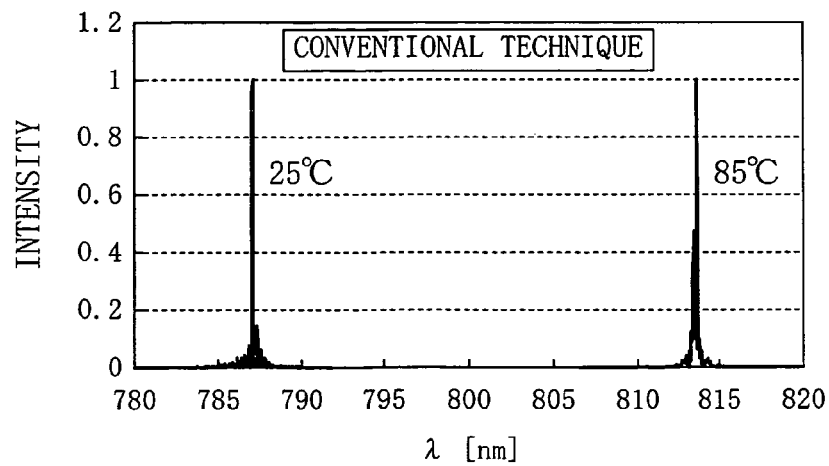
FIG. 6C is a diagram of oscillation spectra obtained at 25° C. and 85° C. in the conventional diode.

Furthermore, as shown in FIGS. 6B and 6C, the full width at half maximum is larger in the structure of this embodiment than in the conventional structure at both temperatures of 25° C. and 85° C., and hence, good self sustained pulsation seems to be caused in this embodiment.

As described so far, when the remaining thickness d1 is defined, a semiconductor laser diode with a good temperature characteristic can be realized while stably keeping the multi-longitudinal mode characteristics with a large full width at half maximum of the oscillation spectrum. Specifically, the remaining thickness d1 is set in a range where the current spread is substantially constant against the increase of the remaining thickness d1 and where the lateral spread of light in the active layer is remarkably increased against the increase of the remaining thickness d1.

For this purpose, the lower limit of the remaining thickness d1 is set to a value where the current spread starts to be substantially constant against the increase of the remaining thickness d1, and the remaining thickness is set to a region where the optical field distribution (the full width at half maximum of the NFP image) is not more than approximately three times as large as the stripe width.

As specific dimensions, as described above, the distance (remaining thickness) d1 from the lower face of the n-type current blocking layer 109 to the upper face of the active layer 104 is set to 0.65 through 1.2 µm (corresponding to a difference $\Delta n$ of $1\times10^{-3}$ through $5\times10^{-5}$) and the stripe width Ws is set to 1.0 through 4.0 µm.

It is noted that the material of each cladding layer preferably has resistance of 0.1 Ωcm or more and specifically, is preferably AlGaInP. In the case where the resistance of the cladding layer is too low (for example, when the resistance is less than 0.1Ω·cm with AlGaAs used), the current is excessively spread in the lateral direction and hence a saturable absorber cannot be formed. Therefore, in order to definitely form a saturable absorber, the cladding layer preferably has the aforementioned resistance.

Figure 7A:
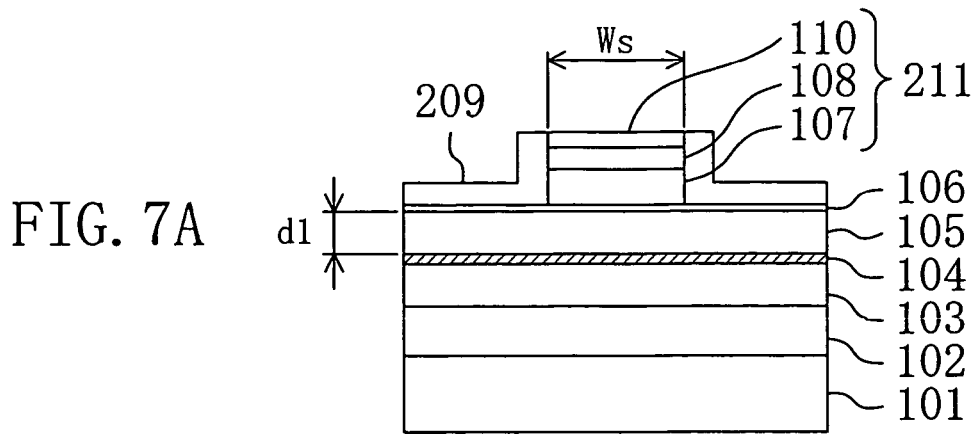
FIGS. 7A, 7B and 7C are diagrams for showing the structure of the semiconductor laser diode of Embodiment 1 in which a vertical ridge structure is formed.
Figure 7B:
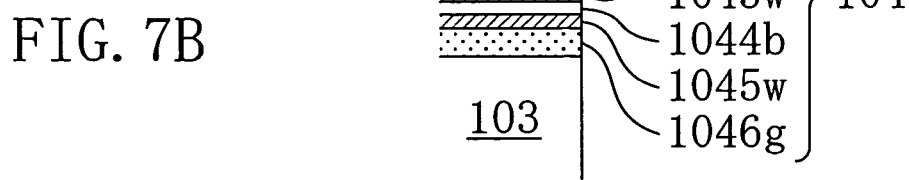
Figure 7C:
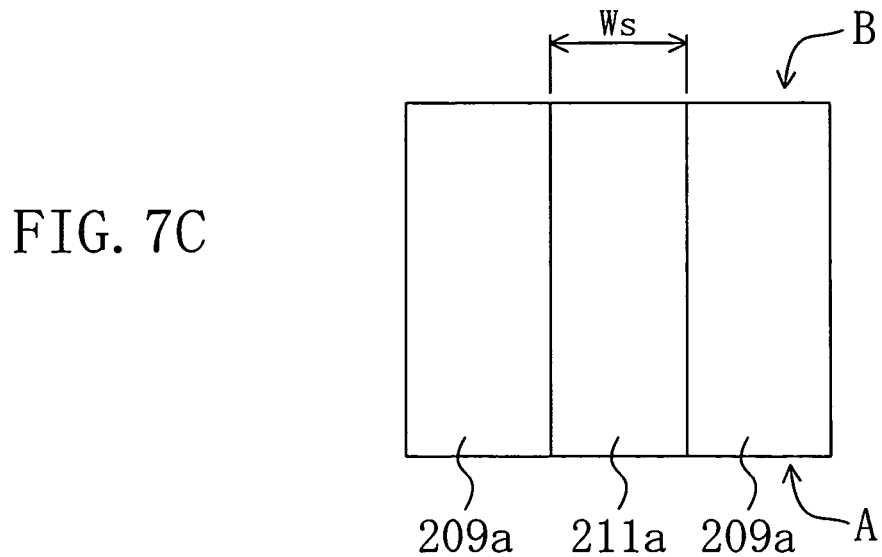

Also, in this embodiment, an inclined ridge, namely, the stripe portion 111 having a larger width on the bottom than on the top as shown in FIG. 1A, is used as the ridge stripe. Instead, a vertical ridge structure having the same width on the bottom and the top may be used. The structure obtained in such a case is shown in FIGS. 7A through 7C, which respectively correspond to FIGS. 1A through 1C. As shown in FIG. 7A, a stripe portion 211 having the same width on the bottom and the top is constructed by a p-type (AlGa)InP second cladding layer 107, a p-type GaInP intermediate layer 108 and a p-type GaAs contact layer 110. Also in this case, a current blocking layer 209 is formed so as to cover the side face of the stripe portion 211.

The rest of the structure is the same as that of the semiconductor laser diode shown in FIGS. 1A through 1C. For example, the structure of an active layer 104 shown in FIG. 7B is the same as that shown in FIG. 1B. Also, FIG. 7C schematically shows the plane structure of the stripe portion 211, and specifically, a shape 211a of the lower face of the stripe portion 211 and a shape 209a of the lower face of the n-type current blocking layer 209 are shown. Furthermore, like reference numerals are used to refer to like elements so as to omit detailed description.

In the case where the vertical ridge structure is used in this manner, the width on the top of the stripe portion 211 is larger than in using the inclined ridge shown in FIG. 1A, and therefore, the differential resistance Rs can be reduced. As a result, the heat generation in the diode is suppressed, so as to improve the temperature characteristic.

Embodiment 2

A semiconductor laser diode according to Embodiment 2 will now be described.

Figure 8A:
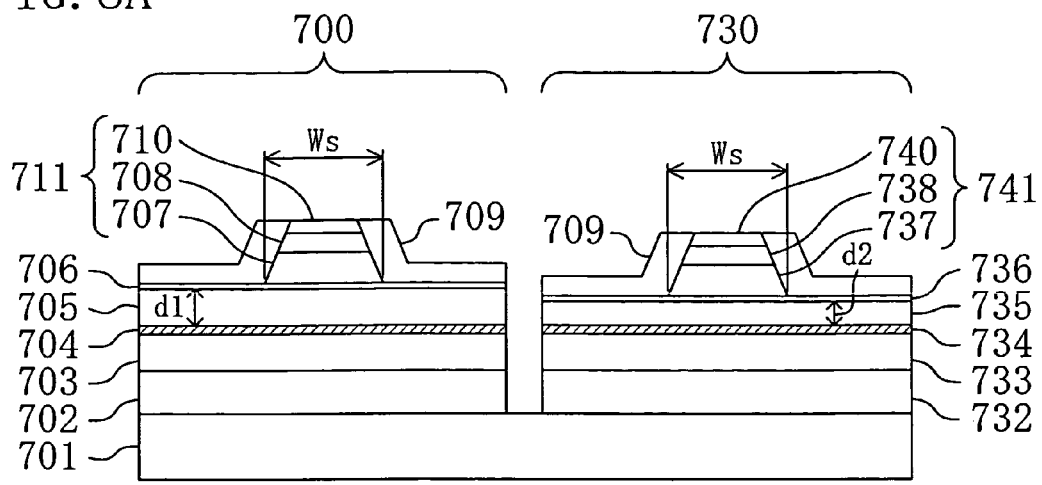
FIGS. 8A, 8B and 8C are diagrams for showing the structure of a semiconductor laser diode according to Embodiment 2 of the invention, and specifically.
Figure 8B:
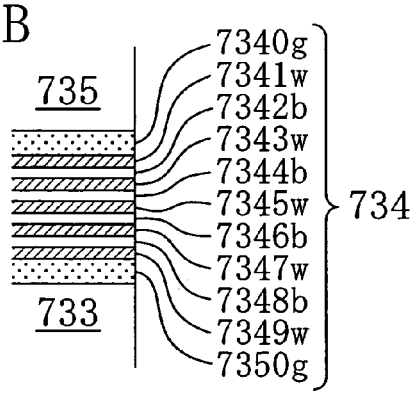
Figure 8C:
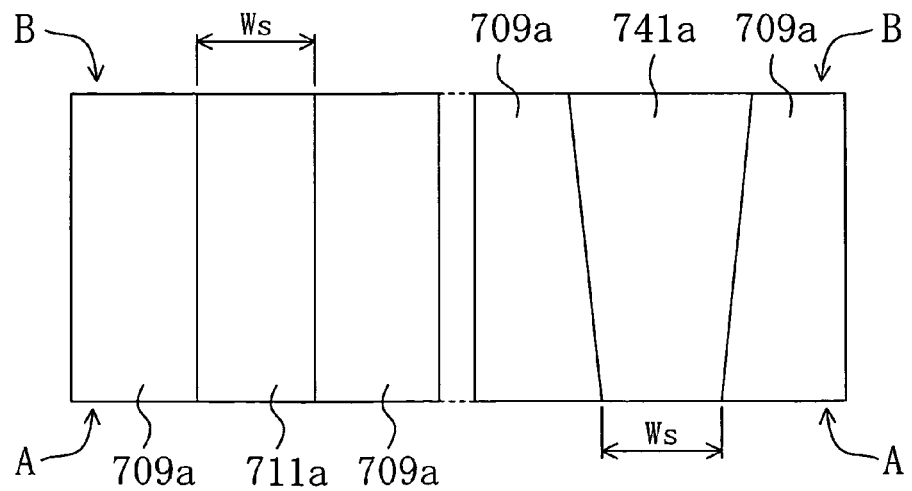

FIGS. 8A, 8B and 8C show the semiconductor laser diode of this embodiment. FIG. 8A is a cross-sectional view thereof. The semiconductor laser diode is a monolithic two-wavelength laser diode in which an infrared laser section 700 and a red laser section 730 are built on one n-type GaAs substrate 701.

First, the infrared laser section 700 has the same structure as that of the semiconductor laser diode of Embodiment 1. Specifically, an n-type GaAs buffer layer 702, an n-type (AlGa)InP cladding layer 703, an active layer 704, a p-type (AlGa)InP first cladding layer 705, a p-type GaInP etching stopper layer 706, a p-type (AlGa)InP second cladding layer 707, a p-type GaInP intermediate layer 708 and a p-type GaAs contact layer 710 are stacked in this order in the upward direction on the n-type GaAs substrate 701 shared with the red laser section 730 independently of the red laser section 730. Thus, the infrared laser section 700 has the double hetero structure in which the active layer is sandwiched between the two cladding layers.

Also, the active layer 704 is, similarly to the active layer 101 of the semiconductor laser diode of Embodiment 1 shown in FIG. 1B, a quantum well active layer including three well layers.

Furthermore, as shown in FIG. 8A, the p-type (AlGa)InP second cladding layer 707, the p-type GaInP intermediate layer 708 and the P-type GaAs contact layer 710 are formed as a ridge stripe in the shape of a mesa stripe, so as to construct a stripe portion 711 having a larger width on the bottom than on the top. An n-type GaAs current blocking layer 709 is formed on the both sides of the stripe portion 711, thereby constructing a current confining structure for confining a region of a current injected into the active layer 704. Such a structure is the same as that shown in FIG. 1A.

Also, a distance (remaining thickness) from the lower face of the current blocking layer 709 to the active layer 704 is shown as a distance d1.

As for the material of each layer of the infrared laser section 700, for example, with respect to the n-type (AlGa)InP cladding layer 703, the p-type (AlGa)InP first cladding layer 705 and the p-type (AlGa)InP second cladding layer 707, an exemplified composition ratio is $(Al_{0.7}Ga_{0.3})_{0.51}In_{0.49}P$. Also, with respect to (AlGa)InP barrier layers 1042b and 1044b included in the active layer 704, an exemplified composition ratio is $(Al_{0.4}Ga_{0.6})_{0.51}In_{0.49}P$ (see FIG. 1B).

Next, the red laser section 730 basically has the same structure as the infrared laser section 700. Specifically, an n-type GaAs buffer layer 732, an n-type (AlGa)InP cladding layer 733, an active layer 734, a p-type (AlGa)InP first cladding layer 735, a p-type GaInP etching stopper layer 736, a p-type (AlGa)InP second cladding layer 737, a p-type GaInP intermediate layer 738 and a p-type GaAs contact layer 740 are stacked in this order in the upward direction on the n-type GaAs substrate 701 shared with the infrared laser section 700 independently of the infrared laser section 700. Thus, the red laser section 730 has the double hetero structure in which the active layer is sandwiched between the two cladding layers.

However, the active layer 734 is a quantum well active layer including five well layers as shown in FIG. 8B. Specifically, five GaInP well layers 7349w, 7347w, 7345w, 7343w and 7341w are successively formed in this order in the upward direction so as to sandwich four (AlGa)InP barrier layers 7348b, 7346b, 7344b and 7342b among them, and this multilayered structure including the nine layers is vertically sandwiched by two (AlGa)InP guide layers 7350g and 7340g. As a result, the layers 7350g, 7349w, 7348b, 7347w, 7346b, 7345w, 7344b, 7343w, 7342b, 7341w and 7340g are successively stacked in this order from the lower side (namely, the side of the n-type (AlGa)InP cladding layer 733).

Furthermore, as shown in FIG. 8A, similarly to the infrared laser section 700, the p-type (AlGa)InP second cladding layer 737, the p-type GaInP intermediate layer 738 and the p-type GaAs contact layer 740 are formed (as a stripe portion 741) in the shape of a mesa stripe, and the n-type GaAs current blocking layer 709 is formed on the both sides of the stripe portion 741, so as to construct a current confining structure.

Moreover, a distance (remaining thickness) from the lower face of the current blocking layer 709 (namely, the lower face of the ridge stripe) to the upper face of the active layer 734 is shown as a distance d2.

As for the material of each layer of the red laser section 730, for example, with respect to the n-type (AlGa)InP cladding layer 733, the p-type (AlGa)InP first cladding layer 735 and the p-type (AlGa)InP second cladding layer 737, an exemplified composition ratio is $(Al_{0.7}Ga_{0.3})_{0.51}In_{0.49}P$. Also, with respect to the (AlGa)InP guide layers 7340g and 7350g and the (AlGa)InP barrier layers 7342b, 7344b, 7346b and 7348b, an exemplified composition ratio is $(Al_{0.5}Ga_{0.5})_{0.51}In_{0.49}P$. Furthermore, with respect to the GaInP well layers 7349w, 7347w, 7345w, 7343w and 7341w, an exemplified composition ratio is $Ga_{0.45}In_{0.57}P$.

Next, FIG. 8C shows the plane shapes of the stripe portion 711 of the infrared laser section 700 and the stripe portion 741 of the red laser section 730. At this point, the lower face of the stripe portion 711 is in a shape 711a having the same width over its whole length from an emitting facet A to a rear facet B similarly to that shown in FIG. 1C. On the contrary, the lower face of the stripe portion 741 of the red laser section 730 is in a shape 741a of a taper stripe structure having a width increasing from the emitting facet A to the rear facet B. In this embodiment, the stripe width on the emitting facet A is indicated as a stripe width Ws of the red laser section 730.

The stripe portion 711 of the infrared laser section 700 and the stripe portion 741 of the red laser section 730 are simultaneously formed. Also, the current blocking layer 709 is formed simultaneously in the infrared laser section 700 and the red laser section 730. Moreover, although not shown in the drawings, p-type electrodes are formed on the p-type GaAs contact layers 710 and 740 and the n-type current blocking layer 709, and n-type electrodes are formed on the lower face of the n-type GaAs substrate 701. These p-type electrodes and n-type electrodes are also simultaneously formed in the infrared laser section 700 and the red laser section 730.

Figure 9A:
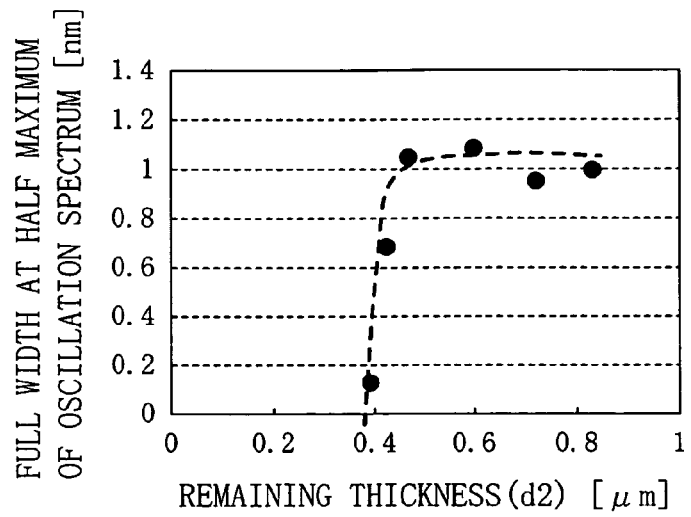
FIG. 9A is a diagram for showing the relationship, in the red laser section of Embodiment 2, between a distance (remaining thickness) d2 from a lower face of a current blocking layer to an upper face of an active layer and the full width at half maximum of an oscillation spectrum

As described so far, the semiconductor laser diode of this embodiment is a monolithic two-wavelength laser diode including the infrared laser section 700 and the red laser section 730. The behavior of the multi-longitudinal mode property (the full width at half maximum of an oscillation spectrum) obtained when the remaining thickness is changed in this semiconductor laser diode is shown in FIG. 9A in the same manner as in Embodiment 1. However, the behavior in the infrared laser section 700 is herein omitted because it is the same as that of the semiconductor laser diode of Embodiment 1, and the behavior in the red laser section 730 alone is shown.

In this case, it is assumed that the stripe width is 3 μm on the emitting facet A and 5 μm on the rear facet B and that the measurement is performed at room temperature and at 3.5 mW.

Figure 9B:
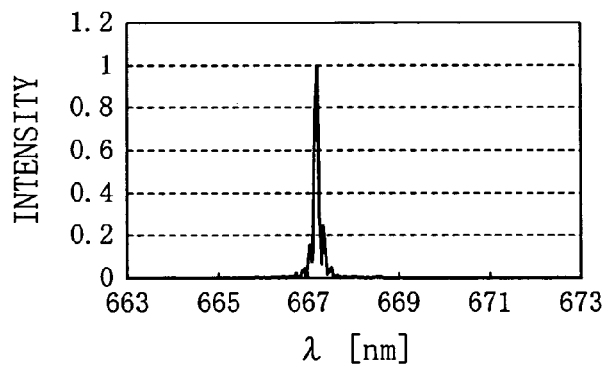
FIGS. 9B, 9C and 9D are diagrams of spectra corresponding to various distances d2.
Figure 9C:
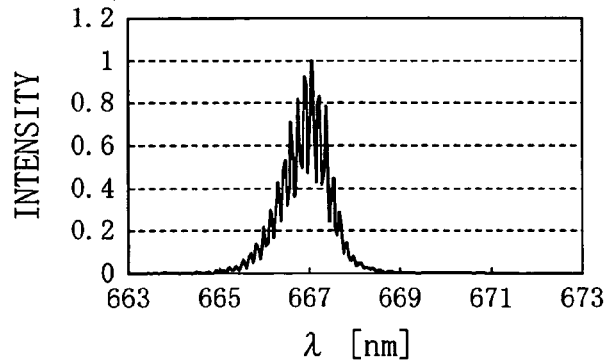
Figure 9D:
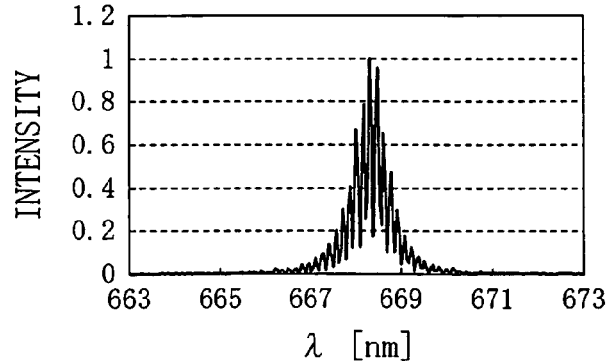

As shown in FIG. 9A, as the remaining thickness d2 is increased, the full width at half maximum of the oscillation spectrum is increased at first, and when the remaining thickness d2 exceeds 0.45 μm, the full width at half maximum of the oscillation spectrum becomes substantially constant. FIGS. 9B, 9C and 9D respectively show the actual spectrum waveforms obtained when the remaining thickness d2 is 0.39 μm, 0.47 μm and 0.72 μm. The oscillation spectrum is close to a single peak in the case shown in FIG. 9B where the remaining thickness d2 is 0.39 μm and is a multi-longitudinal mode spectrum with a large full width at half maximum in the cases shown in FIGS. 9C and 9D where the remaining thickness d2 is 0.47 μm and 0.72 μm.

This can be explained by using an effective refractive index difference Δn between a portion corresponding to the stripe portion 741 and portions corresponding to the both sides of the stripe portion 741.

In the case where the remaining thickness d2 is 0.39 µm, the difference Δn is approximately $1.2 \times 10^{-3}$. Owing to this comparatively large difference Δn, light cannot spread to the side of the ridge, and hence, a saturable absorber is difficult to form. As a result, the full width at half maximum of the oscillation spectrum is small.

On the contrary, in the cases where the remaining thickness d2 is 0.47 µm and 0.72 µm, the difference Δn is as small as approximately $3.8 \times 10^{-4}$ and $3.6 \times 10^{-5}$, respectively. Therefore, light can spread to the side of the ridge, and a saturable absorber is sufficiently formed, so that the multi-longitudinal mode oscillation can be performed. However, when the remaining thickness d2 is 0.72 µm, although not shown in the drawing, a phenomenon that an FFP along the horizontal direction has a double-humped property is observed. Therefore, the range of the remaining thickness d2 for realizing both the stable multi-longitudinal mode oscillation and fundamental lateral mode oscillation is approximately 0.4 µm through 0.7 µm.

Figure 10A:
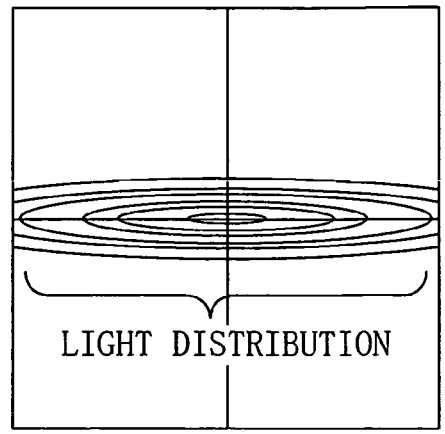
FIG. 10A is an NFP image of a threshold current of the red laser section of the semiconductor laser diode of Embodiment 2 and FIG. 10B is a diagram for showing a laterally spread current and the full width at half maximum of the NFP against the remaining thickness d2.

In a conventional general semiconductor laser diode, the remaining thickness d2 for the self sustained pulsation of red laser is 0.25 µm through 0.4 µm (corresponding to a difference Δn of $3 \times 10^{-3}$ through $1 \times 10^{-3}$). In contrast, although the remaining thickness d2 is as large as 0.4 µm through 0.7 µm (corresponding to a difference Δn of $1 \times 10^{-3}$ through $5 \times 10^{-5}$) in this embodiment, the multi-longitudinal mode oscillation (including the self sustained pulsation) can be performed. The reason is as follows:

FIG. 10A shows an NFP image obtained in a threshold current state with a stripe width set to 3 µm on the emitting facet A and 5 µm on the rear facet B and with a remaining thickness d2 set to 0.47 µm. The degree of light spread can be expressed by using a full width at half maximum obtained from the optical field distribution of the NFP image in the same manner as in Embodiment 1.

Figure 10B:
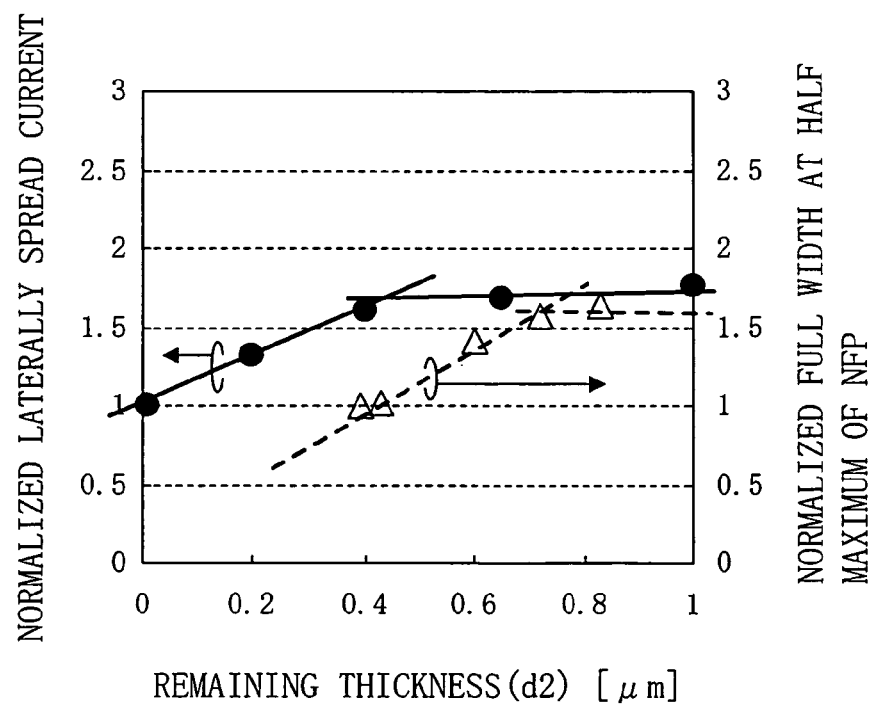

FIG. 10B shows the full width at half maximum of an NFP image obtained in a threshold current state normalized on the basis of a remaining thickness d2 of 0.39 µm (shown with broken lines) and laterally spread current (calculated values) normalized on the basis of the remaining thickness d2 of 0 µm (shown with solid lines). The full width at half maximum of the NFP image is larger at first as the remaining thickness d2 is larger, and when the remaining thickness d2 exceeds approximately 0.7 µm, it becomes almost constant. On the other hand, the laterally spread current is increased as the remaining thickness d2 is increased to approximately 0.4 µm but is almost saturated thereafter.

In this manner, in the range of the remaining thickness d2 of 0.4 through 0.7 µm, the lateral current spread is almost saturated and the optical field distribution (spread) is increased, and therefore, this range can be regarded as a region where a saturable absorber is increased. On the contrary, when the remaining thickness d2 is 0.7 µm or more, the optical field distribution (spread) and the lateral current spread are both substantially constant, and the saturable absorber is not remarkably increased, and as a result, the full width at half maximum of the oscillation spectrum is substantially constant. Accordingly, a region where a saturable absorber can be easily formed is a region where the remaining thickness d2 is 0.4 µm or more. The above-described region where the FFP does not exhibit the double-humped property is the region where the remaining thickness d2 is 0.7 µm or less, and therefore, a range of the remaining thickness d2 for enabling the stable multi-longitudinal mode oscillation is 0.4 µm through 0.7 µm.

Figure 11A:
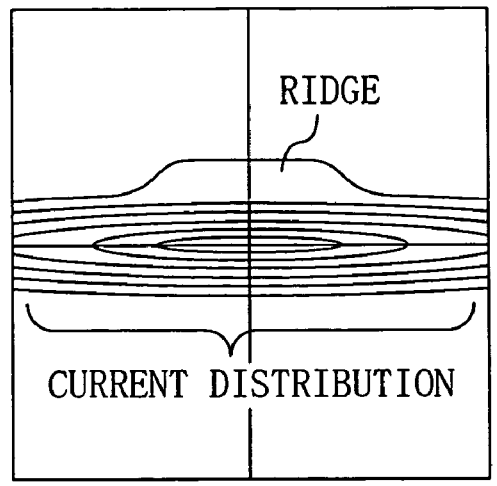
FIG. 11A is an NFP image obtained when a current of 10 mA is allowed to pass through the red laser section of the semiconductor laser diode of Embodiment 2 and FIG. 11B is a diagram for showing the relationship between a stripe width and the full width at half maximum of the NFP.

Next, the degree of the current spread against the stripe width will be described by using an NFP image obtained before laser oscillation. FIG. 11A is an NFP image obtained by allowing a current of 10 mA to pass when the stripe width is 3.3 µm on the emitting facet A and 6 µm on the rear facet B and the remaining thickness d2 is 0.43 µm. Since this NFP image is strongly correlated with a density distribution of a current injected into the active layer, it can be regarded as a current distribution. As shown in FIG. 11A, since the remaining thickness d2 is comparatively large and 0.43 µm, the current is widely spread in the lateral direction, and this spread is 5.9 µm when expressed by using the full width at half maximum. The stripe width Ws on the emitting facet A is 3.3 µm, and hence, the current is spread almost twice as large as the stripe width Ws.

Figure 11B:
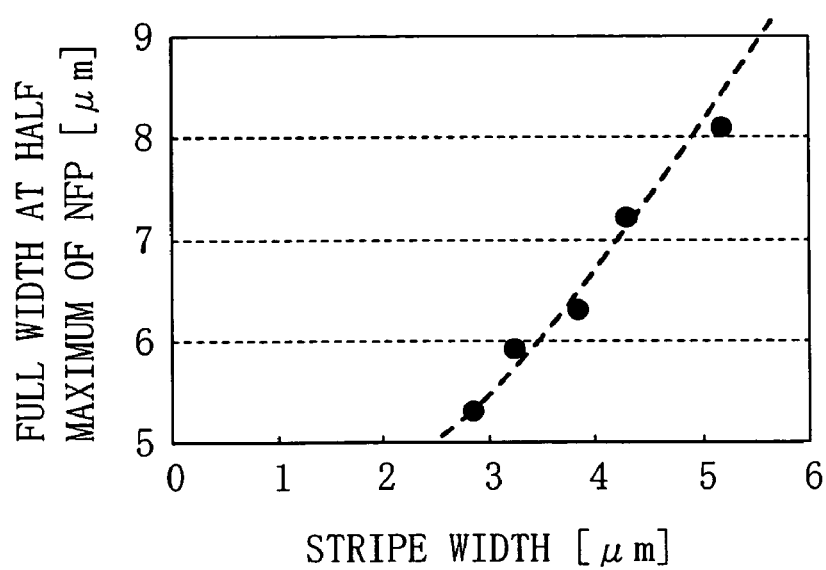

FIG. 11B shows the behavior of the full width at half maximum of the NFP obtained when the stripe width Ws on the emitting face A is changed with the stripe width on the rear facet B fixed to 6 µm. According to FIG. 11B, when the stripe width Ws on the emitting facet A is 2.9 µm, the current spread (full width at half maximum) is 5.3 µm, and the current spread is larger as the stripe width is increased, and when the stripe width Ws is 5 µm, the full width at half maximum is 8 µm or more. In this manner, when the remaining thickness d2 is larger than in the conventional technique, the current spread becomes larger than the stripe width.

Figure 12A:
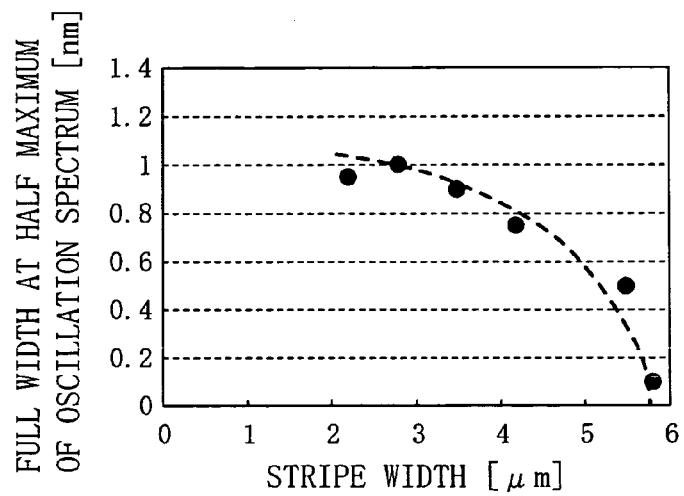
FIG. 12A is a diagram for showing the relationship between the stripe width and the full width at half maximum of an oscillation spectrum obtained in the red laser section of the semiconductor laser diode of Embodiment 2 and FIGS. 12B, 12C and 12D are diagrams of oscillation spectra corresponding to various stripe widths.
Figure 12B:
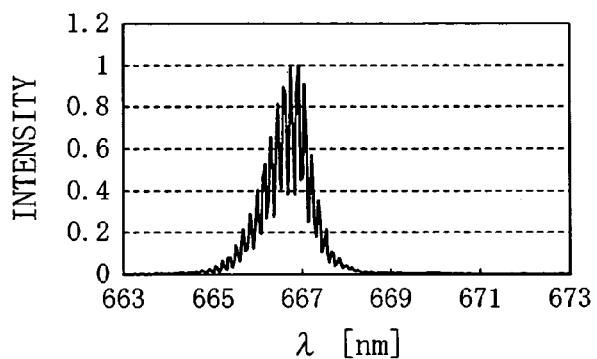
Figure 12C:
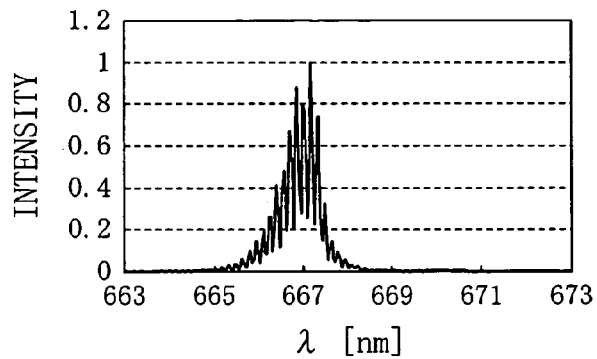
Figure 12D:
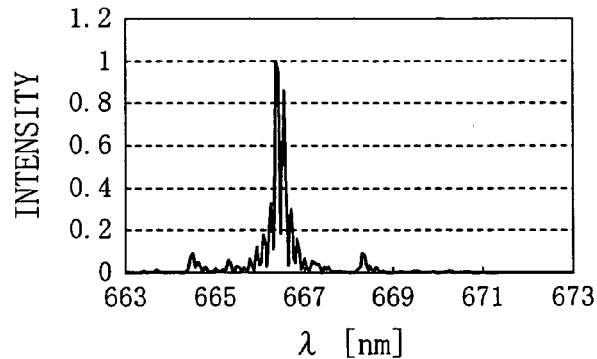

Next, FIG. 12A shows the behavior of the multi-longitudinal mode property (the full width at half maximum of an oscillation spectrum) obtained with the remaining width d2 set to a constant value of 0.45 µm, the stripe width on the rear facet B fixed to 6 µm and the stripe width Ws on the emitting facet A changed. The oscillation spectra obtained when the stripe width Ws on the emitting facet A is 2.2 µm, 4.2 µm and 5.8 µm are respectively shown in FIGS. 12B, 12C and 12D. As shown in FIGS. 12B through 12D, as the stripe width Ws on the emitting facet A is larger, the full width at half maximum of the oscillation spectrum is reduced. This seems for the same reason as that described in Embodiment 1. Specifically, as the stripe width Ws on the emitting facet A is larger, the volume of the active layer into which the current is injected is larger below the ridge stripe portion. As a result, the volume of a saturable absorber formed in the active layer below the current blocking layer is relatively small. Accordingly, the self sustained pulsation is difficult to cause.

Furthermore, when the stripe width Ws is 5.8 µm, a phenomenon that higher-order lateral mode oscillation is caused in an FFP along the horizontal direction and that a kink is caused in the vicinity of 7 mW is observed. This reveals that the upper limit of the stripe width Ws is approximately 5.5 µm in consideration of the characteristics of the diode.

Moreover, when the stripe width is 2.2 µm, non-linearity is caused in external differential efficiency Se in the I-L characteristic. This is because waveguide loss is abruptly reduced when the volume of a saturable absorber is increased and the saturable absorber becomes transparent. Such an I-L characteristic is practically unpreferred because an APC (auto power control) operation is difficult. Accordingly, the lower limit of the stripe width is approximately 2.5 µm.

Figure 13A:
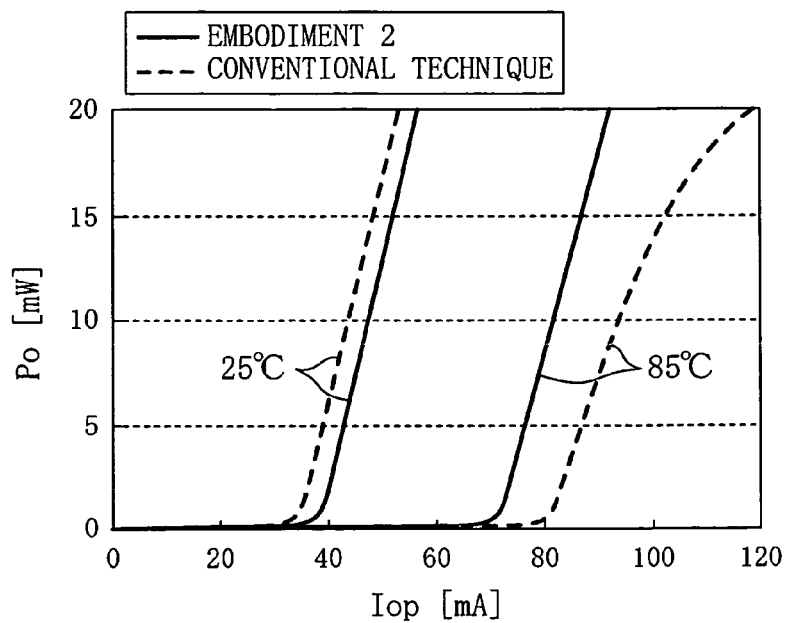
FIG. 13A is a diagram for showing I-L characteristics obtained in the red laser section of Embodiment 2 and a conventional diode.

On the basis of the aforementioned results, the temperature characteristic is compared between the structure of the semiconductor laser diode of this embodiment and the conventional structure. As the results of the comparison, FIG. 13A shows the temperature dependency of the I-L characteristic and FIGS. 13B and 13C respectively show the temperature dependency of the oscillation spectrum in this embodiment and in the conventional technique. At this point, the remaining thickness d2 is 0.42 µm in the structure of this embodiment, and the remaining thickness is 0.33 µm in the conventional structure. When the remaining thickness d2 is converted into a difference Δn, the different Δn is 5×10⁻⁴ in the structure of this embodiment and is 1.4×10⁻³ in the conventional structure. It is noted that the stripe width Ws is 3.2 μm on the emitting facet A and 5.2 μm on the rear facet B in the both structures and the composition ratios are set to the above-described values.

As shown in FIG. 13A, in the I-L characteristic obtained at 25° C., the conventional structure has a lower threshold current. However, in the I-L characteristic obtained at 85° C., the structure of this embodiment has a lower threshold current. This seems for the same reason as that described in Embodiment 1. Specifically, at a temperature of 25° C., the current does not laterally spread widely in the conventional structure because of the smaller remaining thickness, and the unavailable current not related to the oscillation is smaller, and hence, the current is efficiently converted into light. Also, one factor of the good I-L characteristic seems to be that the waveguide loss in the active layer is reduced because the difference Δn is comparatively large. On the other hand, at a temperature of 85° C., the current injected into the active layer is concentrated in a portion directly below the stripe so as to increase the current density in the conventional structure, and a leakage current is caused in the diode so as to generate heat, which degrades the temperature characteristic. In the semiconductor laser diode of this embodiment, the current lateral spread is larger than in the conventional structure, and hence, the current density is lower than in the conventional structure, so as to suppress the occurrence of a leakage current. Thus, the semiconductor diode of this embodiment has wider operation temperature guarantee.

Figure 13B:
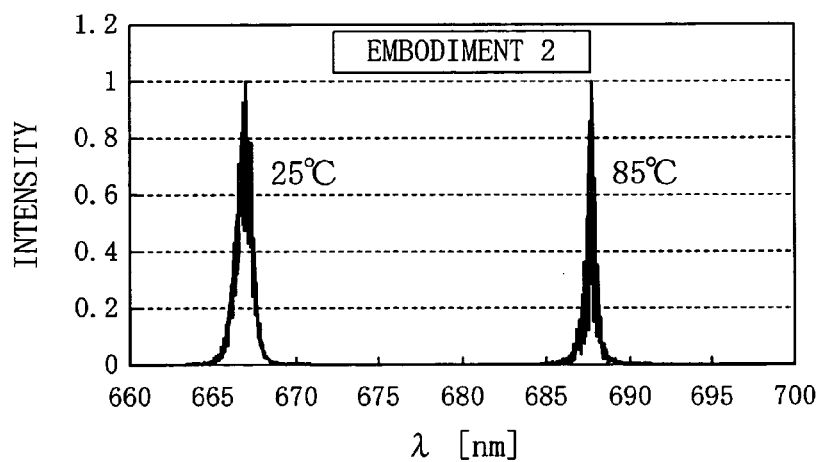
FIG. 13B is a diagram of oscillation spectra obtained at 25° C. and 85° C. in the red laser section of Embodiment 2
Figure 13C:
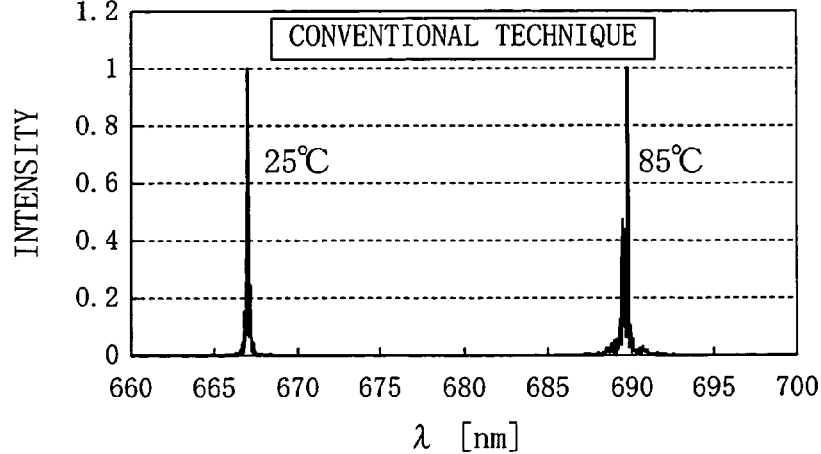
FIG. 13C is a diagram of oscillation spectra obtained at 25° C. and 85° C. in the conventional diode.

Furthermore, as shown in FIGS. 13B and 13C, the full width at half maximum of the oscillation spectrum is larger in the structure of this embodiment than in the conventional structure at both temperatures of 25° C. and 85° C., and hence, a good multi-longitudinal mode characteristic is attained.

As described so far, in the same manner as in Embodiment 1, when the remaining thickness d2 is defined, a semiconductor laser diode with a good temperature characteristic can be realized while stably keeping the multi-longitudinal mode characteristic with a large full width at half maximum of the oscillation spectrum in this embodiment. Specifically, the remaining thickness d2 is set in a range where the current spread is substantially constant against the increase of the remaining thickness d2 and where the lateral spread of light is increased against the increase of the remaining thickness d2.

For this purpose, the lower limit of the remaining thickness d2 is set to a value where the current spread starts to be substantially constant against the increase of the remaining thickness d2, and the remaining thickness is set to a region where the optical field distribution (the full width at half maximum of the NFP) is not more than approximately twice as large as the stripe width.

As specific dimensions, as described above, the distance (remaining thickness) d2 from the lower face of the n-type current blocking layer 709 to the upper face of the active layer 734 is set to 0.4 through 0.7 μm (corresponding to a difference Δn of 1×10⁻³ through 5×10⁻⁵) and an average stripe width (i.e., an average width calculated by assuming that the taper stripe structure is a straight stripe structure) is set to 2.5 through 5.5 μm. In addition, the infrared laser section 700 has the same structure as the semiconductor laser diode of Embodiment 1. Thus, stable characteristics can be attained as the monolithic two-wavelength laser.

It is noted that the material of each cladding layer preferably has resistance of 0.1 Ωcm or more and specifically, is preferably AlGaInP.

Figure 14A:
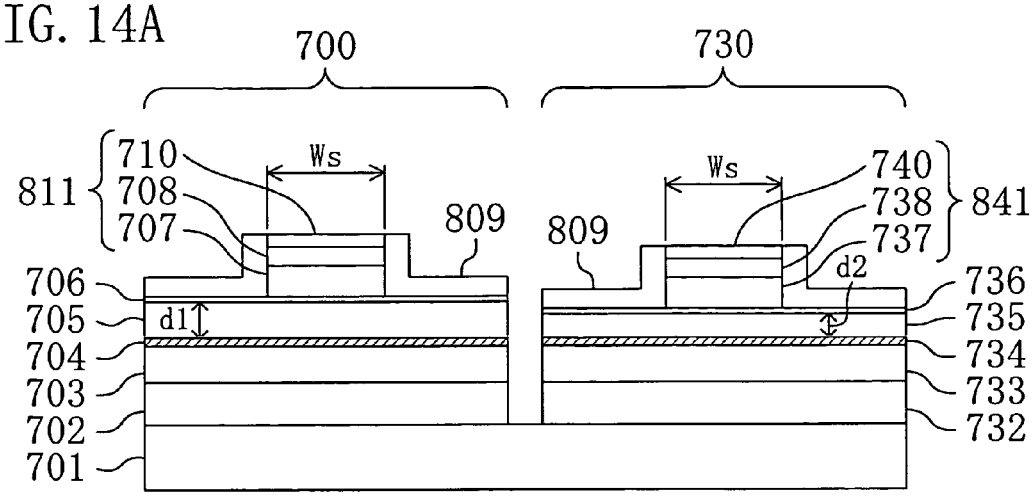
FIGS. 14A, 14B and 14C are diagrams for showing the structure of the semiconductor laser diode of Embodiment 2 in which a vertical ridge structure is formed.
Figure 14B:
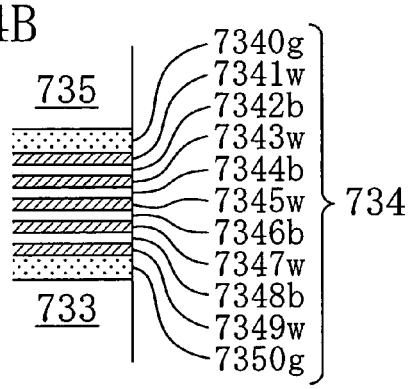
Figure 14C:
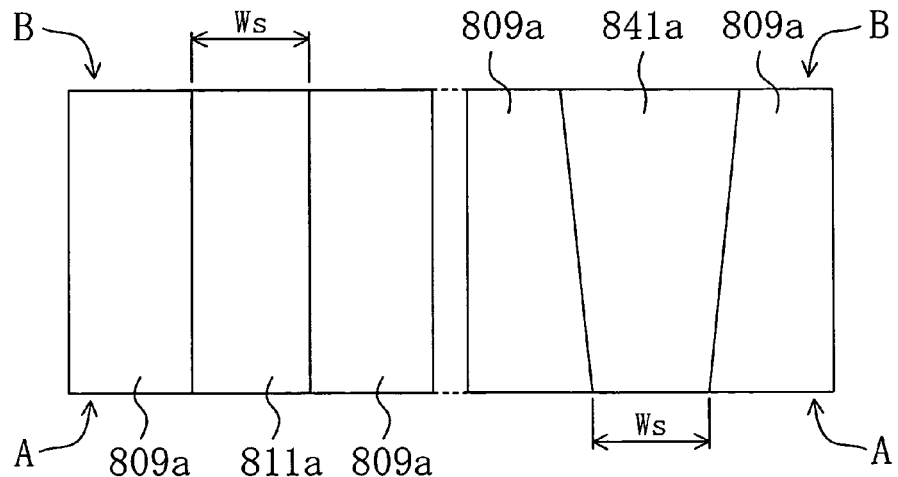

Also, in this embodiment, an inclined ridge, namely, the stripe portion 711 having a larger width on the bottom than on the top as shown in FIG. 8A, is used as the ridge stripe. Instead, a vertical ridge structure having the same width on the bottom and the top may be used in the same manner as described in Embodiment 1. The structure obtained in such a case is shown in FIGS. 14A through 14C, which respectively correspond to FIGS. 8A through 8C. As shown in FIG. 14A, a stripe portion 811 having the same width on the bottom and the top is constructed by a p-type (AlGa)InP second cladding layer 707, a p-type GaInP intermediate layer 708 and a p-type GaAs contact layer 710. Furthermore, a stripe portion 841 having the same width on the bottom and the top is constructed by a p-type (AlGa)InP second cladding layer 737, a p-type GaInP intermediate layer 738 and a p-type GaAs contact layer 740. Also in this case, a current blocking layer 809 is formed so as to cover the side faces of the stripe portions 811 and 841.

The rest of the structure is the same as that of the semiconductor laser diode shown in FIGS. 8A through 8C, and hence, like reference numerals are used to refer to like elements so as to omit detailed description.

In the case where the vertical ridge structure is used in this manner, the width on the top of the stripe portions 811 and 841 is larger than in using the inclined ridge shown in FIG. 8A, and therefore, the differential resistance Rs can be reduced. As a result, the heat generation in the diode is suppressed, so as to improve the temperature characteristic.

In this embodiment, the monolithic two-wavelength laser diode in which the infrared laser section 700 equivalent to the semiconductor laser diode of Embodiment 1 and the red laser section 730 are formed on the shared n-type GaAs substrate 701 is described. Needless to say, a laser diode including the red laser section 730 alone as a light emitting portion for laser oscillation can be formed. Also in this case, it goes without saying that a laser diode capable of stably operating in a wider temperature range than in the conventional technique can be obtained when the red laser section has the remaining thickness described in this embodiment.

Embodiment 3

A semiconductor laser diode according to Embodiment 3 of the invention will now be described.

Figure 15A:
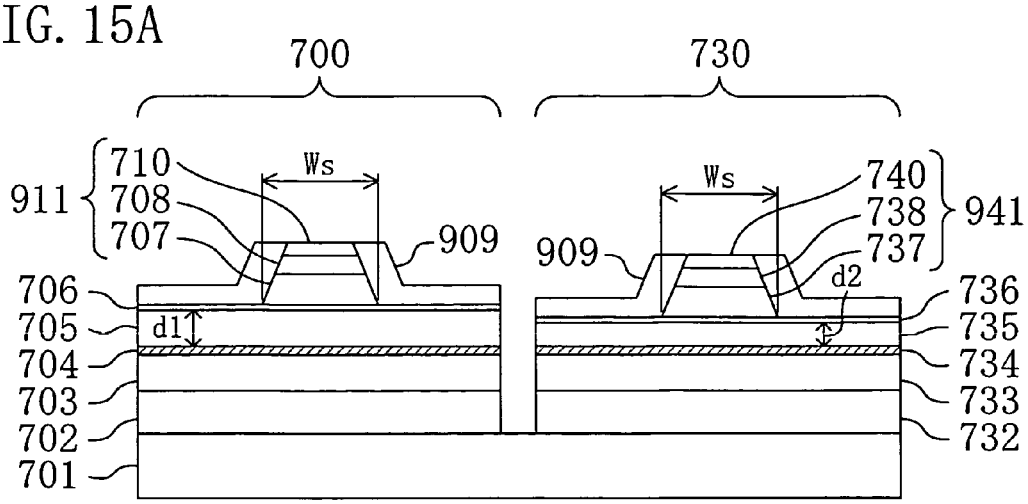
FIGS. 15A, 15B and 15C are diagrams for showing the structure of a semiconductor laser diode according to Embodiment 3 of the invention, and specifically.
Figure 15B:
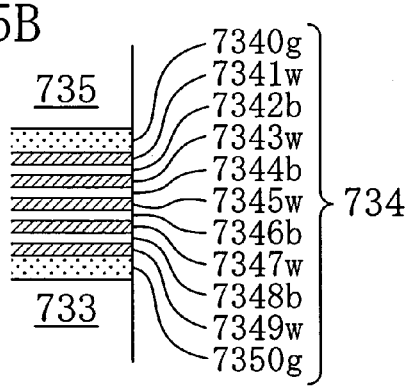
Figure 15C:
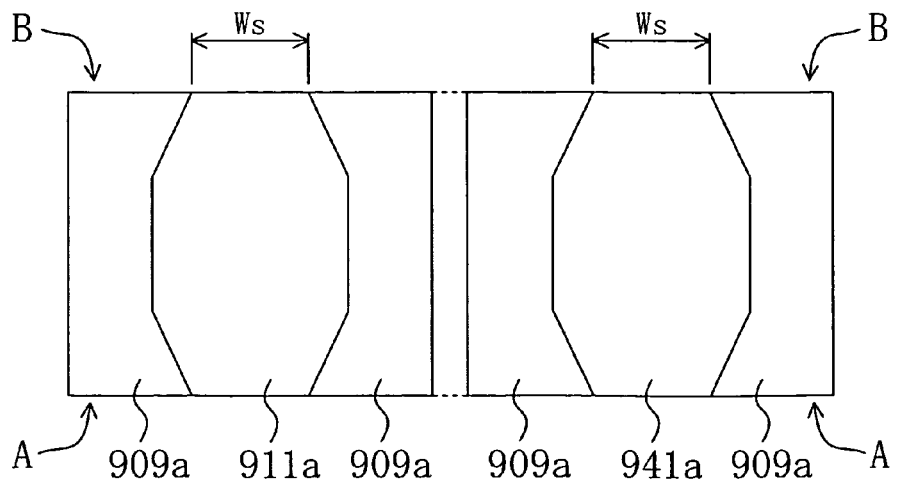

FIGS. 15A, 15B and 15C show the semiconductor laser diode of this embodiment. This semiconductor laser diode has substantially the same structure as the semiconductor laser diode of Embodiment 2 except for one difference. Therefore, the difference of the structure alone will be herein described in detail. Like reference numerals are used in FIGS. 13A through 13C to refer to like elements used in the semiconductor laser diode of Embodiment 2 shown in FIGS. 8A through 8C.

The semiconductor laser diode of this embodiment is different from the semiconductor laser diode of Embodiment 2 in the plane shapes of a stripe portion 911 including a p-type (AlGa)InP second cladding layer 707, a p-type GaInP intermediate layer 708 and a p-type GaAs contact layer 710 and a stripe portion 941 including a p-type (AlGa)InP second cladding layer 737, a p-type GaInP intermediate layer 738 and a p-type GaAs contact layer 740.

Specifically, each of the stripe portions 911 and 941 is in a shape in which its stripe width is gradually increased inwardly from an emitting facet A, is uniform as a straight stripe at the center and is gradually reduced toward a rear facet B as shown in FIG. 15C. In other words, each stripe portion has an inner part having a constant stripe width and tapered parts having widths gradually reduced toward the emitting facet A and toward the rear facet B and continuously disposed on the sides of the inner part.

In such a taper stripe structure, the stripe width can be increased than in the straight stripe structure, and hence, the differential resistance Rs can be reduced to suppress the heat generation of the diode, so as to improve the temperature characteristic.

However, an average of the width of the stripe portion 911 of the infrared laser section 700 (an average width calculated by assuming the taper stripe structure is a straight stripe structure) should be 1 through 4 µm, and an average of the width of the stripe portion 941 of the red laser section 730 should be 2.5 through 5.5 µm. These dimensional ranges are the same as those described in Embodiments 1 and 2. When the average widths are out of these ranges, there arise problems that a kink is caused, that the oscillation spectrum or the FFP exhibits a double-humped property and that the fabrication yield of the laser diode is lowered.

In each of Embodiments 1 through 3, an n-type GaAs layer is used as the current blocking layer. However, a metal film such as a Ti/Au film, a semiconductor film such as an AlGaAs, AlInP or α-Si film, or an insulating film such as a $SiN_x$ or $SiO_x$ film may be used instead. Furthermore, the invention is not limited to the composition ratios such as $(Al_{0.5}Ga_{0.5})_{0.51}In_{0.49}P$.

Moreover, although the number of well layers included in the active layer is three in the infrared laser section and five in the red laser section, good characteristics can be attained as far as the number is three through five in the infrared laser section and four through seven in the red laser section.

Furthermore, the three stripe structures including the straight stripe structure, the taper stripe structure in which the width on the emitting facet A is smaller and the width on the rear facet B is larger and the stripe structure in which the width is larger at the center and is gradually reduced toward the facets are herein described. The invention is not limited to these stripe structures, but a structure in which the width is smaller on the rear facet B and larger on the emitting facet A, a structure in which the width is smaller at the center and is gradually increased toward the facets or the like may be employed. However, an average stripe width (namely, an average width calculated by assuming that a taper stripe structure is a straight stripe structure) should be 1 through 4 µm in the infrared laser section and 2.5 through 5.5 µm in the red laser section.

In addition, it goes without saying that the present invention is applicable to various lasers including an AlGaAs/GaAs-based laser, an AlGaN/InGaN-based laser and a ZnMgSSe/ZnS-based laser.

The semiconductor laser diode of the present invention described so far performs the fundamental lateral mode and the multi-longitudinal mode oscillation stably even at a high temperature and exhibits a good temperature characteristic. Therefore, it is useful as a semiconductor laser diode required to guarantee a wide operation temperature range, and specifically, is useful as a laser light source or the like in the field of optical disk systems.

What is claimed is:

1. A semiconductor laser diode comprising a light emitting portion on a substrate, wherein said light emitting portion includes:
    a first cladding layer;
    an active layer formed on said first cladding layer;
    a second cladding layer formed on said active layer and having a ridge stripe for injecting a current into said active layer; and
    a current blocking layer formed on both sides of said ridge stripe for confining said current in said ridge stripe,
    wherein a distance from a lower face of said current blocking layer to an upper face of said active layer is within a given range, and
    said current spreads beyond a width of said ridge stripe after passing said ridge stripe and before reaching said active layer,
    wherein said given range is set to have a lower limit corresponding to said distance obtained at a point where increase of lateral spread of said current becomes gentle against increase of said distance and an upper limit corresponding to said distance obtained at a point where increase of a full width at half maximum of an NFP (near field pattern) becomes gentle against the increase of said distance,
    wherein said given range is within the range of 0.65 µm to 1.2 µm, inclusive,
    wherein the full width at half maximum of the NFP is within the range of one time to three times the stripe width,
    wherein the width of said ridge stripe is within the range of 1 µm to 4 µm, inclusive,
    wherein said active layer is made of $Al_xGa_{1-x}As$ (wherein $0 \leq x \leq 1$), and said first cladding layer and said second cladding layer are made of an AlGaInP-based material.

2. The semiconductor laser diode of claim 1, wherein said given range is 0.4 µm or more and 0.7 µm or less.

3. A semiconductor laser diode comprising a light emitting portion on a substrate, wherein said light emitting portion includes:
    a first cladding layer,
    an active layer formed on said first cladding layer;
    a second cladding layer formed on said active layer and having a ridge stripe for injecting a current into said active layer; and
    a current blocking layer formed on both sides of said ridge stripe for confining said current in said ridge stripe,
    wherein a distance from a lower face of said current blocking layer to an upper face of said active layer is within a given range, and
    said current spreads beyond a width of said ridge stripe after passing said ridge stripe and before reaching said active layer;
    wherein said given range is set to have a lower limit corresponding to said distance obtained at a point where increase of lateral spread of said current becomes gentle against increase of said distance and an upper limit corresponding to said distance obtained at a point where increase of a full width at half maximum of an NFP (near field pattern) becomes gentle against the increase of said distance,
    wherein said given range is within the range of 0.65 µm to 1.2 µm, inclusive,
    wherein the full width at half maximum of the NFP is within the range of one time to three times the stripe width,
    wherein the width of said ridge stripe is within the range of 1 µm to 4 µm, inclusive,
    wherein said active layer is made of $Ga_yIn_{1-y}P$ (wherein $0 \leq y \leq 1$), and
    said first cladding layer and said second cladding layer are made of an AlGaInP-based material.

4. The semiconductor laser diode of claim 1, wherein the width of said ridge stripe is within the range of 2.5 µm to 5.5 µm, inclusive.

5. The semiconductor laser diode of claim 1, wherein said ridge stripe has side faces vertical to a principal plane of said substrate.

6. A semiconductor laser diode comprising, on a substrate, at least a first light emitting portion and a second light emitting portion, wherein each of said first light emitting portion and said second light emitting portion includes:
   a first cladding layer;
   an active layer formed on said first cladding layer;
   a second cladding layer formed on said active layer and having a ridge stripe for injecting a current into said active layer; and
   a current blocking layer formed on both sides of said ridge stripe for confining said current in said ridge stripe,
   a distance from a lower face of said current blocking layer to an upper face of said active layer is in a given range in both of said first light emitting portion and said second light emitting portion, and
   said current spreads beyond a width of said ridge stripe after passing said ridge stripe and before reaching said active layer in both of said first light emitting portion and said second light emitting portion,
   wherein said given range in said first light emitting portion is within the range of 0.65 μm to 1.2 μm, inclusive, and said given range in said second light emitting portion is within the range of 0.4 μm to 0.7 μm, inclusive,
   wherein the width of said ridge stripe of said first light emitting portion is within the range of 1.0 μm to 4.0 μm, inclusive, and the width of said ridge stripe of said second light emitting portion is within the range of 2.5 μm to 5.5 μm, inclusive,
   wherein in said first light emitting portion, a full width at half maximum of an NFP (near field pattern) is within the range of one time to three times the stripe width,
   wherein in said second light emitting portion a full width at half maximum of an NFP is within the range of one time to twice the stripe width,
   wherein said active layer of said first light emitting portion is made of $Al_xGa_{1-x}As$ (wherein $0 \leq x \leq 1$),
   said active layer of said second light emitting portion is made of $Ga_yIn_{1-y}P$ (wherein $0 < y < 1$), and
   said first cladding layer and said second cladding layer are made of an AlGaInP-based material.

7. The semiconductor laser diode of claim 6, wherein said ridge stripe is simultaneously formed in said first light emitting portion and said second light emitting portion.

8. The semiconductor laser diode of claim 6, wherein said ridge stripe has side faces vertical to a principal plane of said substrate in at least one of said first light emitting portion and said second light emitting portion.

9. The semiconductor laser diode of claim 6, wherein said ridge stripe has a taper stripe structure having a changing width in at least one of said first light emitting portion and said second light emitting portion.

10. The semiconductor laser diode of claim 9, wherein said taper stripe structure has a width gradually increased from a side of an emitting facet for emitting light toward a side of a rear facet opposing said emitting facet.

11. The semiconductor laser diode of claim 9, wherein said taper stripe structure has a width gradually reduced from a center thereof toward a side of an emitting facet for emitting light and toward a side of a rear facet opposing said emitting facet.

12. A semiconductor laser diode comprising a light emitting portion on a substrate, wherein said light emitting portion includes:
   a first cladding layer;
   an active layer formed on said first cladding layer;
   a second cladding layer formed on said active layer and having a ridge stripe for injecting a current into said active layer; and
   a current blocking layer formed on both sides of said ridge stripe for confining said current in said ridge stripe,
   wherein a distance from a lower face of said current blocking layer to an upper face of said active layer is within a given range, and
   said current spreads beyond a width of said ridge stripe after passing said ridge stripe and before reaching said active layer,
   wherein said given range is within the range of 0.65 μm to 1.2 μm, inclusive,
   wherein a full width at half maximum of an NFP (near field pattern) is within the range of one time to three times the stripe width,
   wherein the width of said ridge stripe is within the range of 1 μm to 4 μm, inclusive,
   wherein said active layer is made of $Al_xGa_{1-x}As$ (wherein $0 \leq x \leq 1$), and said first cladding layer and said second cladding layer are made of an AlGaInP-based material.

13. A semiconductor laser diode comprising a light emitting portion on a substrate, wherein said light emitting portion includes:
   a first cladding layer;
   an active layer formed on said first cladding layer;
   a second cladding layer formed on said active layer and having a ridge stripe for injecting a current into said active layer; and
   a current blocking layer formed on both sides of said ridge stripe for confining said current in said ridge stripe,
   wherein a distance from a lower face of said current blocking layer to an upper face of said active layer is within a given range, and
   said current spreads beyond a width of said ridge stripe after passing said ridge stripe and before reaching said active layer,
   wherein said given range is within the range of 0.4 μm to 0.7 μm, inclusive,
   wherein a full width at half maximum of an NFP (near field pattern) is within the range of one time to three times the stripe width,
   wherein the width of said ridge stripe is within the range of 2.5 to 5.5 μm, inclusive,
   wherein said active layer is made of $Ga_yIn_{1-y}P$ (wherein $0 \leq y \leq 1$), and
   said first cladding layer and said second cladding layer are made of an AlGaInP-based material.

* * * * *